(12) United States Patent
Wang et al.

(10) Patent No.: US 12,514,007 B2
(45) Date of Patent: Dec. 30, 2025

(54) SOLID-STATE IMAGE SENSOR INCLUDING LIGHT-SPLITTING STRUCTURE

(71) Applicant: VisEra Technologies Company Limited, Hsin-Chu (TW)

(72) Inventors: Chun-Yuan Wang, Hsin-Chu (TW); Ching-Hua Li, Hsin-Chu (TW); Zong-Ru Tu, Hsin-Chu (TW); Yu-Chi Chang, Hsin-Chu (TW); Han-Lin Wu, Hsin-Chu (TW); Hung-Jen Tsai, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 699 days.

(21) Appl. No.: 17/726,202

(22) Filed: Apr. 21, 2022

(65) Prior Publication Data
US 2023/0343808 A1    Oct. 26, 2023

(51) Int. Cl.
*H10F 39/18*    (2025.01)
*H10F 39/00*    (2025.01)

(52) U.S. Cl.
CPC ....... *H10F 39/182* (2025.01); *H10F 39/8053* (2025.01); *H10F 39/806* (2025.01); *H10F 39/807* (2025.01)

(58) Field of Classification Search
CPC ......... H01L 27/14645; H01L 27/14621; H01L 27/14625; H01L 27/1463; H01L 27/146; H01L 27/14627; H01L 27/14629; H01L 27/14603; H10F 39/182; H10F 39/8053; H10F 39/806; H10F 39/807; H10F 39/12; H10F 39/8063; H10F 39/8067; H10F 39/802
See application file for complete search history.

(56) References Cited

U.S. PATENT DOCUMENTS

| | | | |
|---|---|---|---|
| 2014/0339606 A1* | 11/2014 | Lin | H01L 27/14621 438/70 |
| 2017/0092684 A1* | 3/2017 | Chang | H01L 27/1463 |
| 2018/0158864 A1* | 6/2018 | Kim | H01L 27/14831 |
| 2019/0088704 A1* | 3/2019 | Jang | H01L 27/14685 |

(Continued)

FOREIGN PATENT DOCUMENTS

| | | |
|---|---|---|
| CN | 107039470 A | 8/2017 |
| JP | 2021145121 A | 9/2021 |

(Continued)

*Primary Examiner* — Jennifer D Bennett
(74) *Attorney, Agent, or Firm* — MUNCY, GEISSLER, OLDS & LOWE, P.C.

(57) ABSTRACT

A solid-state image sensor is provided. The solid-state image sensor includes photoelectric conversion elements and a color filter layer disposed above the photoelectric conversion elements. The color filter layer has a first color filter segment and a second color filter segment adjacent to the first color filter segment. The first color filter segment and the second color filter segment correspond to different colors. The solid-state image sensor further includes a light-splitting structure disposed in the first color filter segment or the second color filter segment and a grid structure disposed between the first color filter segment and the second color filter segment. The light-splitting structure is separated from the grid structure.

15 Claims, 33 Drawing Sheets

(56) References Cited

U.S. PATENT DOCUMENTS

| | | | |
|---|---|---|---|
| 2019/0148430 A1 | 5/2019 | Chu et al. | |
| 2019/0165009 A1 | 5/2019 | Wu et al. | |
| 2020/0235148 A1 | 7/2020 | Shim | |
| 2020/0403025 A1* | 12/2020 | Kim | H01L 27/1463 |
| 2021/0118929 A1 | 4/2021 | Yang et al. | |
| 2021/0144321 A1* | 5/2021 | Yamashita | H04N 25/772 |
| 2023/0282662 A1* | 9/2023 | Lee | H01L 27/14605 |

FOREIGN PATENT DOCUMENTS

| | | |
|---|---|---|
| KR | 10-2018-0065169 A | 6/2018 |
| KR | 10-2021-0114837 | 9/2021 |
| TW | 201712855 A | 4/2017 |
| TW | 202135304 A | 9/2021 |
| WO | WO2020013130 A1 | 1/2020 |

\* cited by examiner

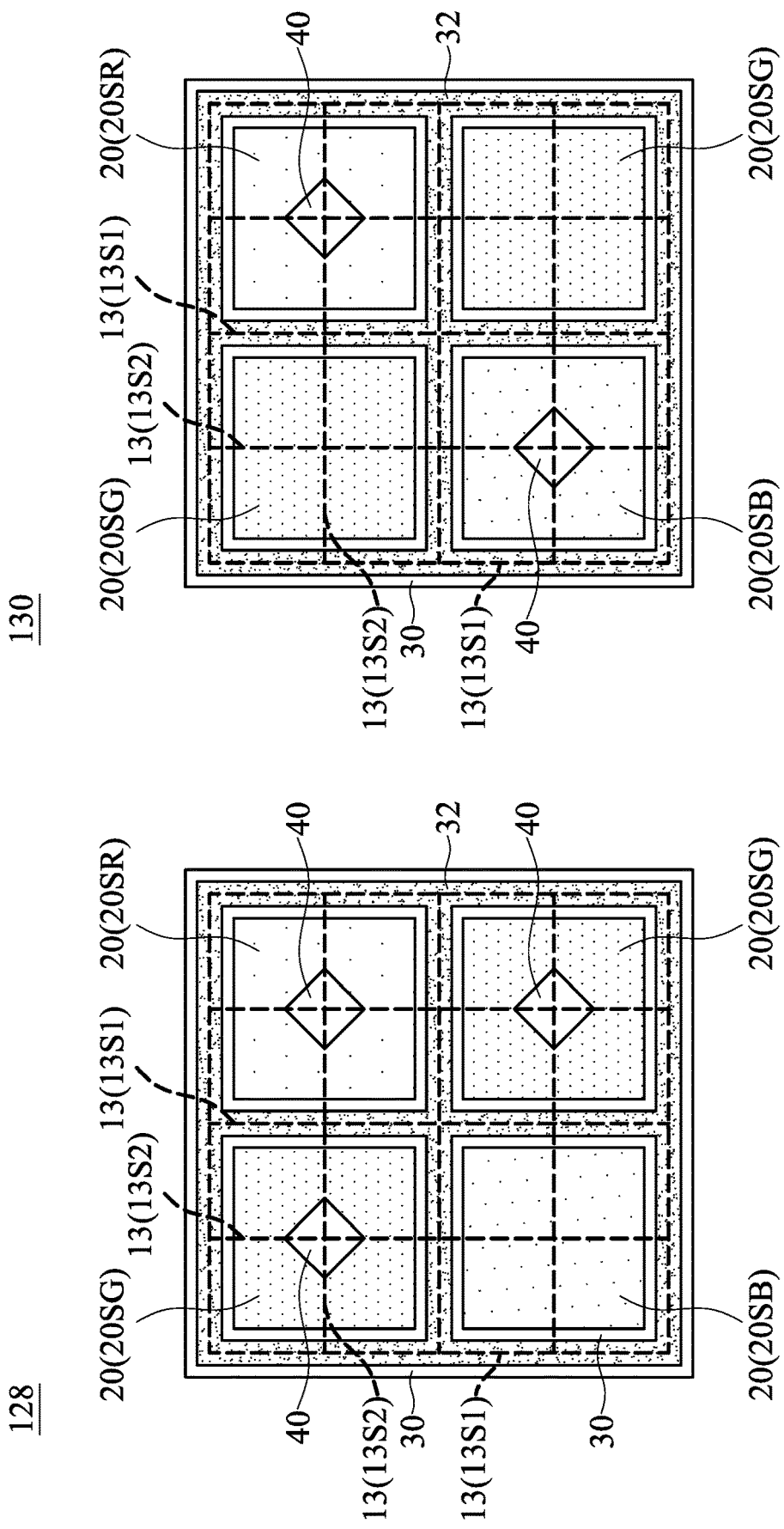

SOLID-STATE IMAGE SENSOR INCLUDING LIGHT-SPLITTING STRUCTURE

BACKGROUND

Technical Field

The embodiments of the present disclosure relate to image sensors, and in particular they relate to solid-state image sensors that include a light-splitting structure disposed in the color filter layer.

Description of the Related Art

Solid-state image sensors (e.g., charge-coupled device (CCD) image sensors, complementary metal-oxide semiconductor (CMOS) image sensors, and so on) have been widely used in various image-capturing apparatuses such as digital still-image cameras, digital video cameras, and the like. The light-sensing portion in the solid-state image sensor may be formed at each of pixels, and signal electric charges may be generated according to the amount of light received in the light-sensing portion. In addition, the signal electric charges generated in the light-sensing portion may be transmitted and amplified, whereby an image signal is obtained.

In traditional multi-PD (i.e., one micro lens corresponds to two, four, or more photo diodes) solid-state image sensor, after light with long wavelength enters the solid-state image sensor, it may be focused on the isolation structure (e.g., deep trench isolations (DTI)), which may cause strong scattering and generate crosstalk. Therefore, there are still various challenges in the design and manufacturing of solid-state image sensors.

BRIEF SUMMARY

In some embodiments of the present disclosure, the solid-state image sensor includes a light-splitting structure disposed in (the color filter segment of) the color filter layer, which may effectively reduce scattering and crosstalk, thereby improving the quality of the image signal from the photoelectric conversion elements of the solid-state image sensors.

In accordance with some embodiments of the present disclosure, a solid-state image sensor is provided. The solid-state image sensor includes photoelectric conversion elements and a color filter layer disposed above the photoelectric conversion elements. The color filter layer has a first color filter segment and a second color filter segment adjacent to the first color filter segment. The first color filter segment and the second color filter segment correspond to different colors. The solid-state image sensor further includes a light-splitting structure disposed in the first color filter segment or the second color filter segment and a grid structure disposed between the first color filter segment and the second color filter segment. The light-splitting structure is separated from the grid structure.

In some embodiments, the photoelectric conversion elements are divided into first photoelectric conversion elements and second photoelectric conversion elements. Each the first color filter segment corresponds to the first photoelectric conversion elements, and each second color filter segment corresponds to the second photoelectric conversion elements.

In some embodiments, the solid-state image sensor includes an isolation structure disposed between the photoelectric conversion elements and having first isolation segments and second isolation segments. The first isolation segments are disposed between the first photoelectric conversion elements and the second photoelectric conversion elements, and the second isolation segments are disposed between the first photoelectric conversion elements and between the second photoelectric conversion elements. The grid structure corresponds to the first isolation segments, and the light-splitting structure corresponds to at least one second isolation segment.

In some embodiments, from the top view of the solid-state image sensor, the light-splitting structure overlaps the corresponding second isolation segment.

In some embodiments, from the top view of the solid-state image sensor, when the profile of the light-splitting structure is cross-shaped, the light-splitting structure is offset from the corresponding second isolation segment by 0-45 degrees.

In some embodiments, the grid structure has a first shift with respect to the first isolation segments, and the light-splitting structure has a second shift with respect to the corresponding second isolation segment.

In some embodiments, the first shift is different from the second shift.

In some embodiments, the height of the light-splitting structure is equal to or less than the height of the grid structure.

In some embodiments, from the top view of the solid-state image sensor, the profile of the light-splitting structure is circular, square, rectangular or cross-shaped.

In some embodiments, the width of the light-splitting structure is between 50 nm and 200 nm.

In some embodiments, the ratio of the height of the light-splitting structure to the height of the color filter layer is between 0.3 and 0.9.

In some embodiments, the refractive index of the light-splitting structure is between 1 and 1.45.

In some embodiments, the light-splitting structure has a first portion disposed on the center of the first color filter segment or the second color filter segment and a second portion disposed near at least one corner of the first color filter segment or the second color filter segment.

In some embodiments, the light-splitting structure corresponds to two photoelectric conversion elements or four photoelectric conversion elements.

In some embodiments, the solid-state image sensor includes an inner pillar disposed on the bottom of the light-splitting structure. The inner pillar includes nontransparent material.

In some embodiments, the width of the inner pillar is between 50 nm and 100 nm, and the height of the inner pillar is less than 150 nm.

In some embodiments, the solid-state image sensor further includes an auxiliary light-splitting structure disposed on a bottom of the light-splitting structure.

In some embodiments, the auxiliary light-splitting structure is further disposed on a bottom of the grid structure.

In some embodiments, the auxiliary light-splitting structure includes at least one material that is different from the light-splitting structure, and the refractive index of the auxiliary light-splitting structure is between 1 and 1.65.

In some embodiments, the width of the auxiliary light-splitting structure is equal to or greater than the width of the light-splitting structure, and the height of the auxiliary light-splitting structure is between 50 nm and 350 nm.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

FIGS. 23A-23F are top views illustrating a portion of the solid-state image sensors in accordance with some other embodiments of the present disclosure.

DETAILED DESCRIPTION

Figure 1:
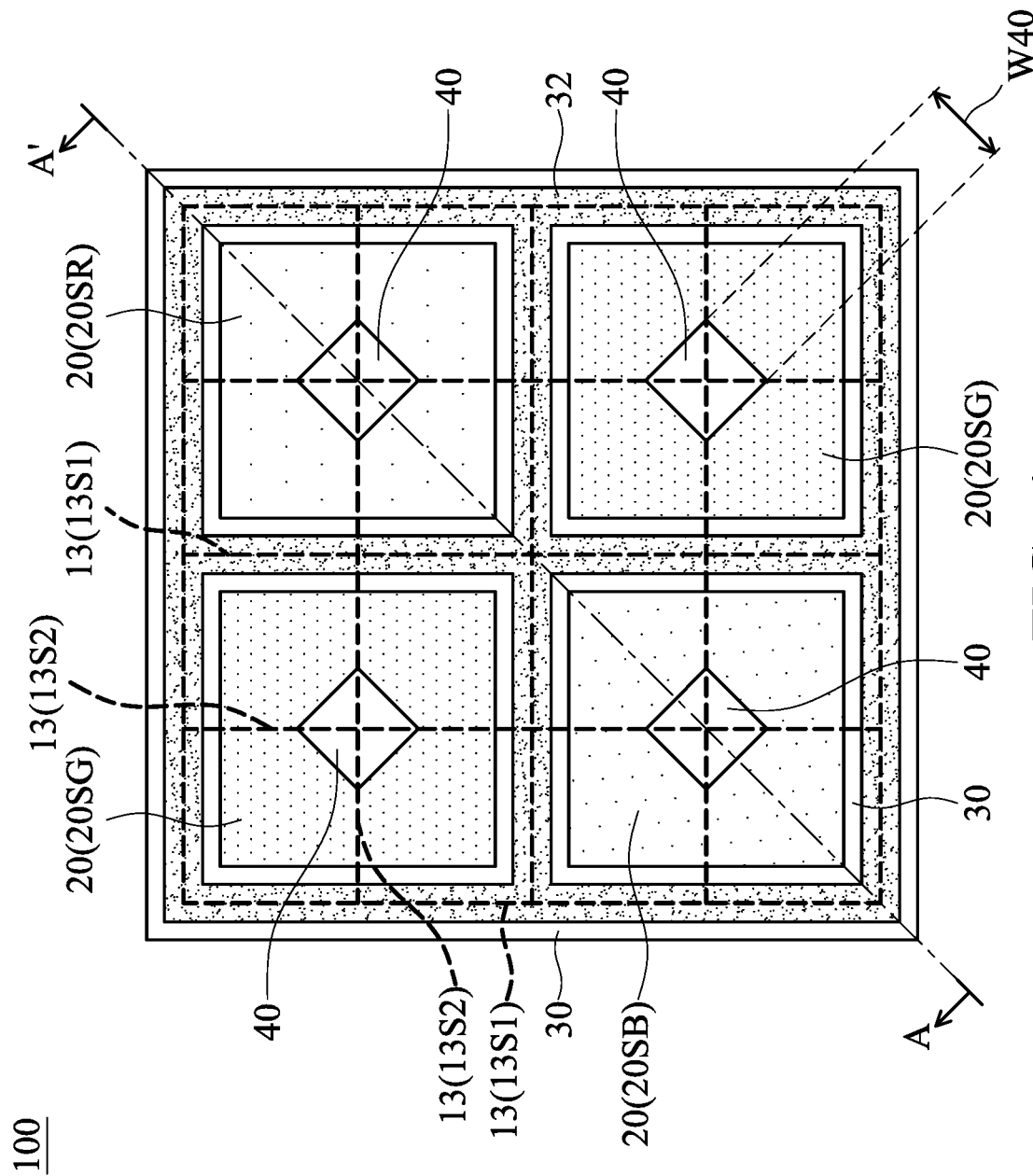
FIG. 1 is a top view illustrating a portion of the solid-state image sensor in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
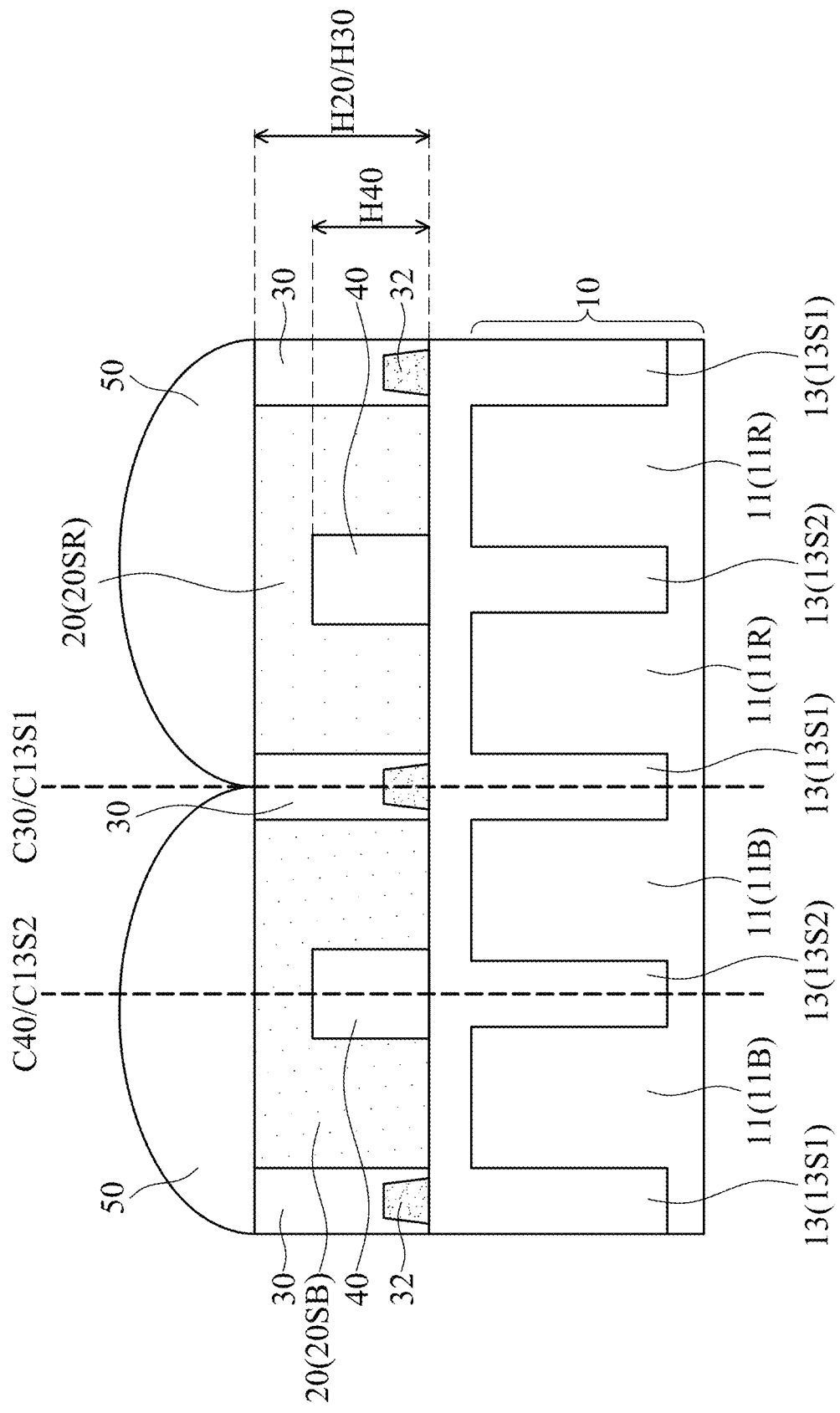
FIG. 2 is a cross-sectional view that may illustrate a portion of the solid-state image sensor in accordance with some embodiments of the present disclosure.

FIG. 1 is a top view illustrating a portion of the solid-state image sensor 100 in accordance with some embodiments of the present disclosure. FIG. 2 is a cross-sectional view CS1 that may illustrate a portion of the solid-state image sensor 100 in accordance with some embodiments of the present disclosure. For example, FIG. 2 may be a cross-sectional view of a portion of the solid-state image sensor 100 along line A-A' in FIG. 1. It should be noted that some components of the solid-state image sensor 100 have been omitted in FIG. 1 and FIG. 2 for the sake of brevity.

Referring to FIG. 2, in some embodiments, the solid-state image sensor 100 includes a semiconductor substrate 10. The semiconductor substrate 10 may be a wafer or a chip. For example, the semiconductor substrate 10 may include silicon, but the present disclosure is not limited thereto.

In some embodiments, the semiconductor substrate 10 has a plurality of photoelectric conversion elements 11, such as photoelectric conversion elements 11B and photoelectric conversion elements 11R as shown in FIG. 2. The photoelectric conversion elements 11 are used for receiving different color lights. For example, the photoelectric conversion elements 11B may be used for receiving blue light, and the photoelectric conversion elements 11R may be used for receiving red light, but the present disclosure is not limited thereto. The semiconductor substrate 10 may have other photoelectric conversion elements that may be used for receiving, for example, green, yellow, white, cyan light, or IR/NIR, which may be adjusted depending on actual needs.

As shown in FIG. 2, in some embodiments, the solid-state image sensor 100 includes an isolation structure 13 disposed between the photoelectric conversion elements 11. For example, the isolation structure 13 may include a shallow trench isolation (STI) or a deep trench isolations (DTI). The isolation structure 13 may be formed in the semiconductor substrate 10 using etching process to form trenches and filling the trenches with an insulating or dielectric material, but the present disclosure is not limited thereto.

As shown in the cross-sectional view CS1 of FIG. 2, in some embodiments, the isolation structure 13 has (or is divided into) first isolation segments 13S1 and second isolation segments 13S2, the first isolation segments 13S1 are disposed between the photoelectric conversion elements 11B and the photoelectric conversion elements 11R, and the second isolation segments 13S2 are disposed between the photoelectric conversion elements 11B and between the photoelectric conversion elements 11R. In other words, the first isolation segments 13S1 may be used to separate the photoelectric conversion elements 11 that receive different color lights, and the second isolation segments 13S2 may be used to separate the photoelectric conversion elements 11 that receive the same color light. It should be noted that the first isolation segments 13S1 and the second isolation segments 13S2 are illustrated as dashed lines in the top view of FIG. 1.

Referring to FIG. 1 and FIG. 2, in some embodiments, the solid-state image sensor 100 includes a color filter layer 20 disposed above the photoelectric conversion elements 11 (the semiconductor substrate 10). In some embodiments, the color filter layer 20 has (or is divided into) color filter segments that correspond to the photoelectric conversion elements 11. For example, as shown in FIG. 2, the color filter layer 20 may have a blue color filter segment 20SB that corresponds to the photoelectric conversion elements 11B, and a red color filter segment 20SR that corresponds to the photoelectric conversion elements 11R. Moreover, as shown in FIG. 1, the color filter layer 20 may have a green color filter segment 20SG (there are two green color filter segments 20SG shown in FIG. 1) that corresponds to other photoelectric conversion elements, but the present disclosure is not limited thereto.

In some other embodiments, the color filter layer 20 has (or is divided into) other color filter segments. For example, the color filter layer 20 may have a yellow color filter segment, a white color filter segment, a cyan color filter segment, a magenta color filter segment, or an IR/NIR color filter segment, but the present disclosure is not limited thereto.

As shown in FIG. 1 and FIG. 2, in some embodiments, the solid-state image sensor 100 includes a grid structure 30 disposed between the color filter segments. For example, as shown in FIG. 1 (and FIG. 2), the grid structure 30 may be disposed between the green color filter segment 20SG and the red color filter segment 20SR, and between the green color filter segment 20SG and the blue color filter segment 20SB, but the present disclosure is not limited thereto. The grid structure 30 may include a transparent dielectric material that has a low refractive index in the range from about 1.0 to about 1.99. In some embodiments, the refractive index of the grid structure 30 is lower than the refractive index of the color filter layer 20 (that includes red color filter segment 20SR, green color filter segment 20SG, blue color filter segment 20SB, and so on).

The grid structure 30 may be formed by depositing a dielectric layer on the semiconductor substrate 10 and then patterning the dielectric layer using photolithography and etching processes, but the present disclosure is not limited thereto. As shown in FIG. 2, in some embodiments, the grid structure 30 corresponds to the first isolation segments 13S1. For example, the central axis C30 of the grid structure 30 may overlap the central axis C13S1 of the first isolation segments 13S1 as shown in FIG. 2. Moreover, the grid structure 30 may be aligned with the first isolation segments 13S1, but the present disclosure is not limited thereto.

Referring to FIG. 1 and FIG. 2, in some embodiments, the solid-state image sensor 100 includes a light-splitting structure 40 disposed in at least one color filter segment. For example, as shown in FIG. 1 and FIG. 2, the light-splitting structures 40 may be disposed in the red color filter segment 20SR, the green color filter segment 20SG, and the blue color filter segment 20SB, but the present disclosure is not limited thereto.

The material and the manufacturing method of the light-splitting structure 40 may be the same or similar to those of the grid structure 30. In other words, the light-splitting structure 40 may include a transparent dielectric material, but the present disclosure is not limited thereto. In some embodiments, the refractive index of the light-splitting structure 40 is between about 1 and about 1.45.

As shown in FIG. 1 and FIG. 2, in some embodiments, the light-splitting structure 40 is separated from the grid structure 30. Moreover, in some embodiments, the light-splitting structure 40 corresponds to at least one second isolation segment 13S2. For example, the central axis C40 of the light-splitting structure 40 may overlap the central axis C13S2 of the corresponding second isolation segment 13S2 as shown in FIG. 2, but the present disclosure is not limited thereto.

In some embodiments, from the top view of the solid-state image sensor 100 (e.g., FIG. 1), the profile of the light-splitting structure 40 is square, but the present disclosure is not limited thereto. In some other embodiments, the profile of the light-splitting structure 40 is circular, rectangular, cross-shaped, or any other suitable shape. Moreover, in some embodiments, the width W40 of the light-splitting structure 40 is between about 50 nm and about 200 nm. Here, the width W40 of the light-splitting structure 40 is defined as the shortest distance of two parallel sides of the light-splitting structure 40. Take the solid-state image sensor 100 (which is shown in FIG. 1) as an example, the width W40 of the light-splitting structure 40 is defined as the side length of the square.

As shown in FIG. 2, in some embodiments, the height H20 of the color filter layer 20 is equal to the height H30 of the grid structure 30. Moreover, in some embodiments, the height H40 of the light-splitting structure 40 is lower than the height H20 of the color filter layer 20. In some embodiments, the ratio of the height H40 of the light-splitting structure 40 to the height H20 of the color filter layer 20 (i.e., H40/H20) is between about 0.3 and about 0.9.

In the embodiments of the present disclosure, the light-splitting structure 40 disposed in (the color filter segment of) the color filter layer 20 may effectively reduce scattering and crosstalk, thereby improving the quality of the image signal from the photoelectric conversion elements 11 of the solid-state image sensor 100. If the ratio of the height H40 of the light-splitting structure 40 to the height H20 of the color filter layer 20 (i.e., H40/H20) is less than 0.3, then the light-splitting structure 40 may not reduce scattering and crosstalk; if the ratio of the height H40 of the light-splitting structure 40 to the height H20 of the color filter layer 20 (i.e., H40/H20) is greater than 0.9, then crosstalk may occur in the color filter layer 20.

In the embodiment shown in FIG. 1, the light-splitting structure 40 is disposed in every color filter segment (e.g., red color filter segment 20SR, green color filter segment 20SG, and blue color filter segment 20SB), but the present disclosure is not limited thereto. In some other embodiments, the light-splitting structure 40 is disposed merely in the specific color filter segment (e.g., green color filter segment 20SG). As shown in FIG. 1, each splitting structure 40 corresponds to four photoelectric conversion elements 11, and the four photoelectric conversion elements 11 form a 2×2 array, but the present disclosure is not limited thereto. In some other embodiments, the light-splitting structure 40 corresponds to two photoelectric conversion elements 11.

As shown in FIG. 1 and FIG. 2, the solid-state image sensor 100 includes a light-shielding layer 32 disposed on the bottom of the grid structure 30. The light-shielding layer 32 may include metal and may be referred to as a metal grid structure. For example, the metal may include gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto.

As shown in FIG. 2, the solid-state image sensor 100 includes condensing structures 50 disposed above the color filter layer 20. The condensing structure 50 may include glass, epoxy resin, silicone resin, polyurethane, any other applicable material, or a combination thereof, but the present disclosure is not limited thereto. For example, the condensing structure 50 may be formed by a photoresist reflow method, a hot embossing method, any other applicable method, or a combination thereof. Moreover, the steps of forming the condensing structure 50 may include a spin coating process, a lithography process, an etching process, any other applicable process, or a combination thereof, but the present disclosure is not limited thereto.

As shown in FIG. 2, in some embodiments, each condensing structure 50 corresponds to one color filter segment (e.g., red color filter segment 20SR, green color filter segment 20SG, or blue color filter segment 20SB). Similarly, in some embodiments (e.g., the embodiment shown in FIG. 1), each condensing structure 50 corresponds to four photoelectric conversion elements 11, and the four photoelectric conversion elements 11 form a 2×2 array (which may be referred to as quadratic photo diodes (QPD)), but the present disclosure is not limited thereto. In some other embodiments, each condensing structure 50 corresponds to two photoelectric conversion elements 11 (which may be referred to as dual photo diodes (DPD)).

The condensing structure 50 may be a micro-lens. For example, the micro-lens may include a semi-convex lens or a convex lens, but the present disclosure is not limited thereto. The condensing structure 50 may also include micro-pyramid structures (e.g., circular cone, quadrangular pyramid, and so on), or micro-trapezoidal structures (e.g., flat top cone, truncated square pyramid, and so on). Alternatively, the condensing structure 50 may be a gradient-index structure.

Figure 3:
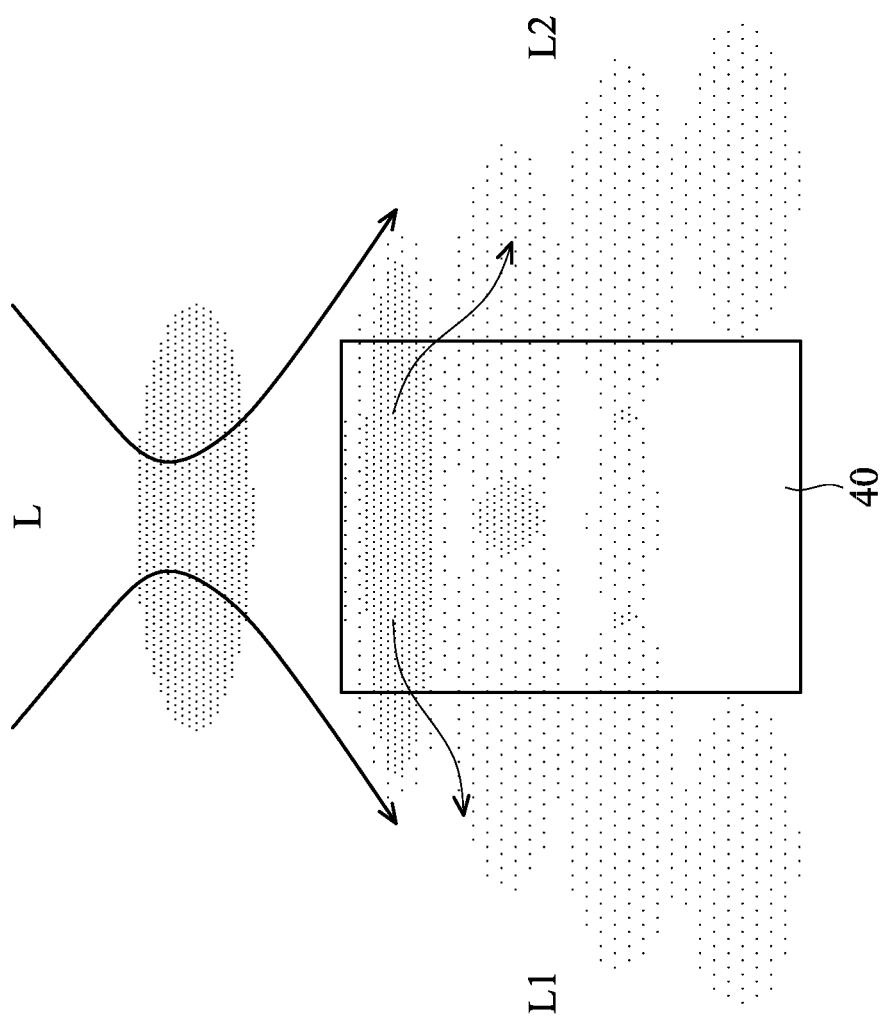
FIG. 3 is a schematic diagram of the energy field distribution of incident light.

FIG. 3 is a schematic diagram of the energy field distribution of incident light L. Referring to FIG. 3, when the incident light L enters the solid-state image sensor 100 (through the condensing structure 50) and contacts the light-splitting structure 40, it may be split (divided) into light L1 and light L2. Since the light-splitting structure 40 includes a transparent dielectric material that has a low refractive index (e.g., between about 1 and about 1.45), the incident light L is only split with low energy loss, and the energy field of the incident light L near the center of the light-splitting structure 40 may present an evanescent wave as shown in FIG. 3.

Figure 4:
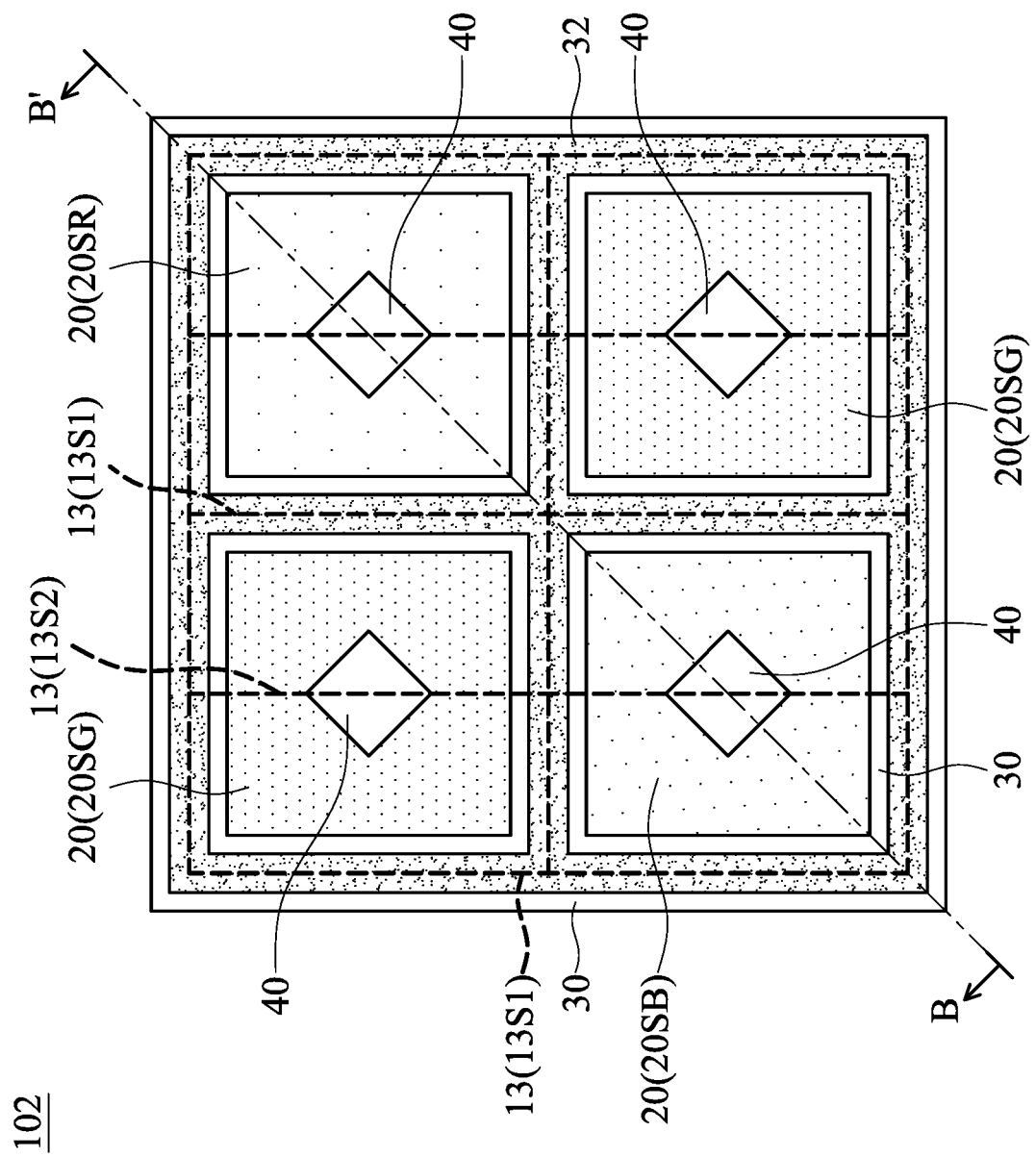
FIG. 4 is a top view illustrating a portion of the solid-state image sensor in accordance with some other embodiments of the present disclosure.
Figure 5:
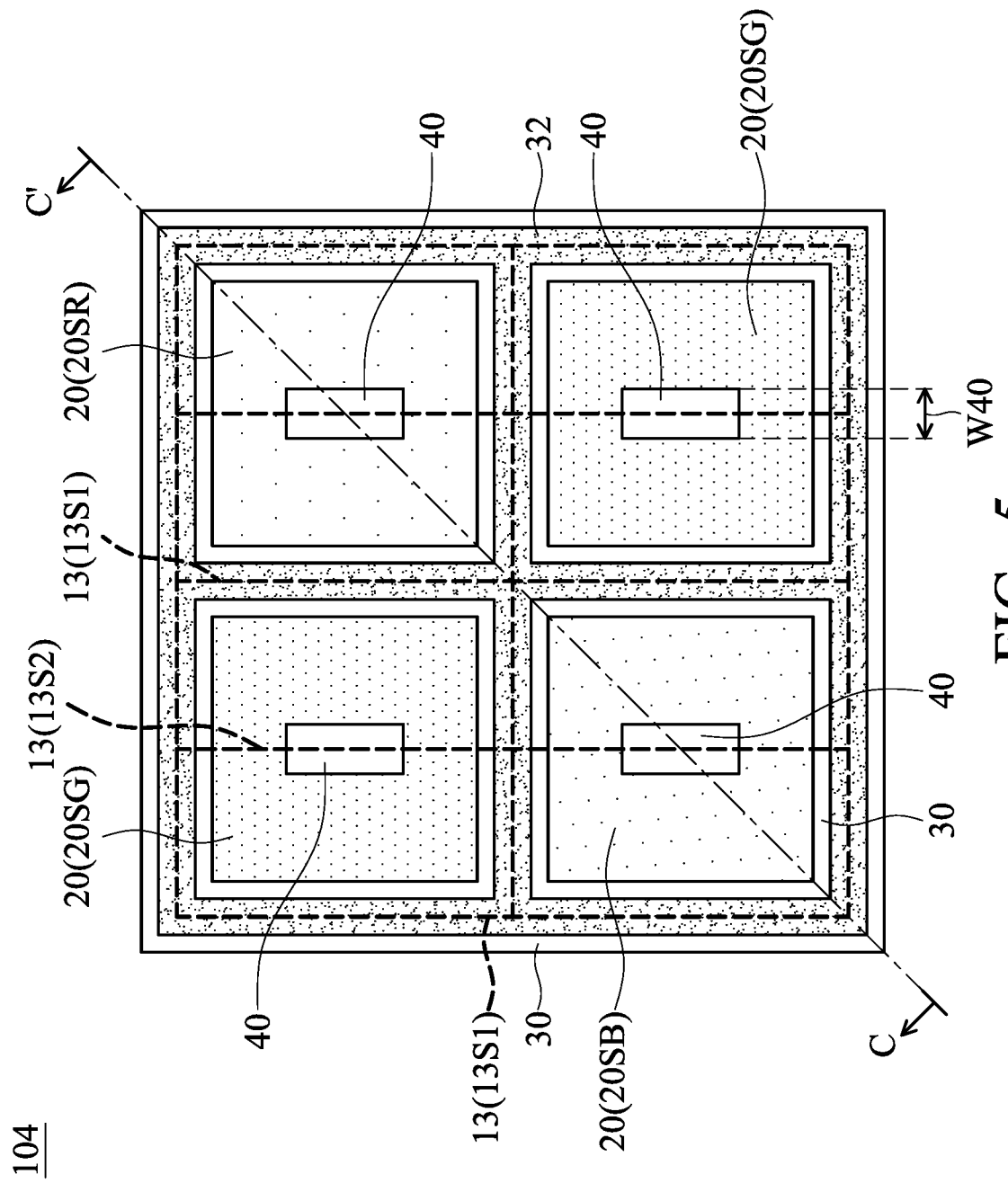
FIG. 5 is a top view illustrating a portion of the solid-state image sensor in accordance with some other embodiments of the present disclosure.
Figure 6:
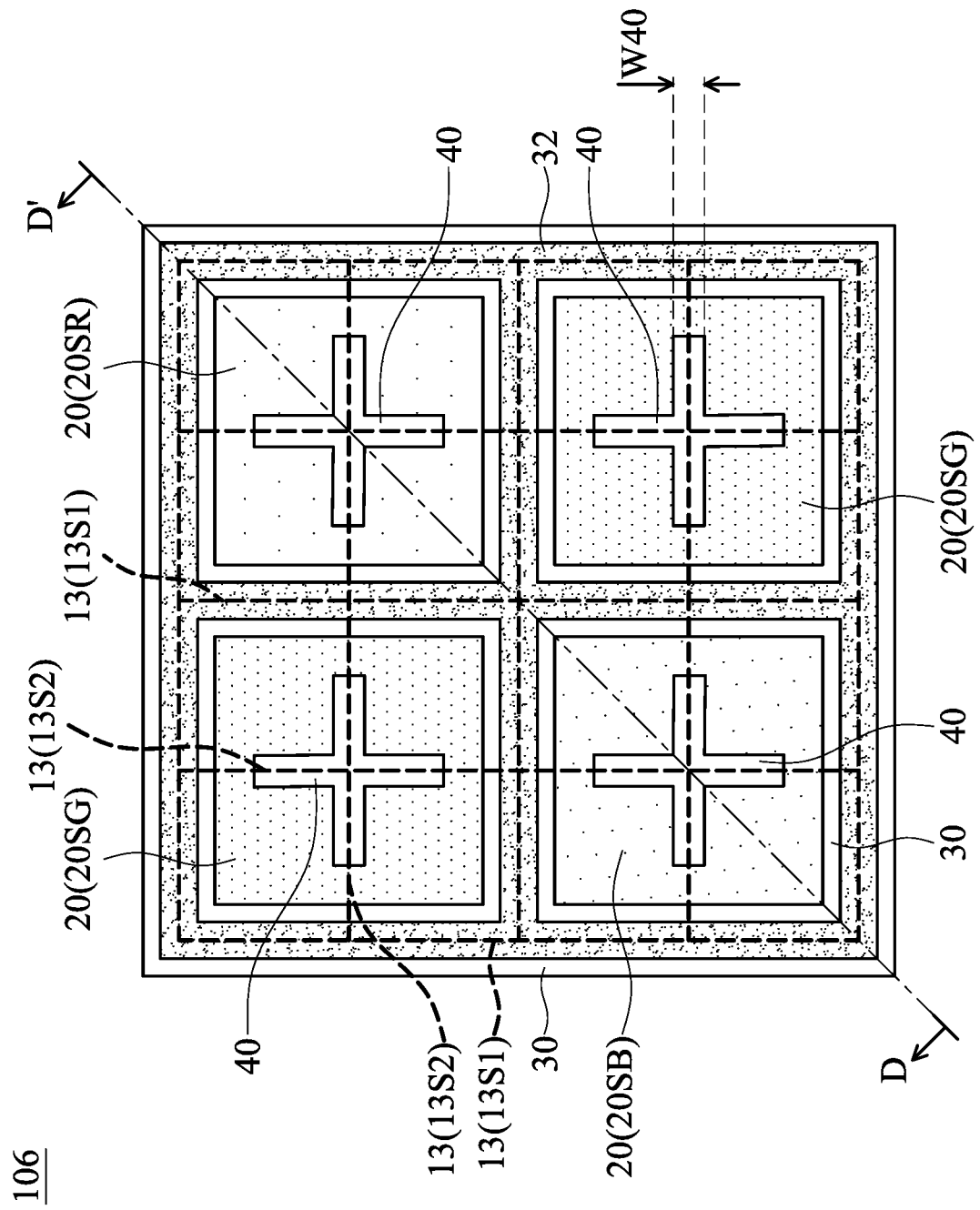
FIG. 6 is a top view illustrating a portion of the solid-state image sensor in accordance with some other embodiments of the present disclosure.

FIG. 4 is a top view illustrating a portion of the solid-state image sensor 102 in accordance with some other embodiments of the present disclosure. FIG. 5 is a top view illustrating a portion of the solid-state image sensor 104 in accordance with some other embodiments of the present disclosure. FIG. 6 is a top view illustrating a portion of the solid-state image sensor 106 in accordance with some other embodiments of the present disclosure. For example, the solid-state image sensor 102 shown in FIG. 4, the solid-state image sensor 104 shown in FIG. 5, and the solid-state image sensor 106 shown in FIG. 6 may have a similar cross-sectional view to the solid-state image sensor 100 shown in FIG. 1.

In other words, FIG. 2 may also be a cross-sectional view of a portion of the solid-state image sensor 102 along line B-B' in FIG. 4, a portion of the solid-state image sensor 104 along line C-C' in FIG. 5, or a portion of the solid-state image sensor 106 along line D-D' in FIG. 6. Similarly, some components of the solid-state image sensor 102, the solid-state image sensor 104, and the solid-state image sensor 106 have been omitted in FIG. 4 to FIG. 6 for the sake of brevity.

Referring to FIG. 4, the solid-state image sensor 102 has a similar structure to the solid-state image sensor 100 shown in FIG. 1. The main difference from the solid-state image sensor 100 shown in FIG. 1 is that each light-splitting structure 40 corresponds to two photoelectric conversion elements 11, and the two photoelectric conversion elements 11 form a 1×2 (or 2×1) array. Furthermore, each condensing structure 50 (not shown in FIG. 4) corresponds to two photoelectric conversion elements 11 (which may be referred to as dual photo diodes (DPD)).

Referring to FIG. 5, the solid-state image sensor 104 has a similar structure to the solid-state image sensor 102 shown in FIG. 4. The main difference from the solid-state image sensor 102 shown in FIG. 4 is that from the top view of the solid-state image sensor 104 (e.g., FIG. 5), the profile of the light-splitting structure 40 is rectangular. Moreover, in some embodiments, the width W40 of the light-splitting structure 40 is between about 50 nm and about 200 nm. Take the solid-state image sensor 104 (which is shown in FIG. 5) as an example, the width W40 of the light-splitting structure 40 is defined as the short side length of the rectangle.

Referring to FIG. 6, the solid-state image sensor 106 has a similar structure to the solid-state image sensor 100 shown in FIG. 1. The main difference from the solid-state image sensor 100 shown in FIG. 1 is that from the top view of the solid-state image sensor 106 (e.g., FIG. 6), the profile of the light-splitting structure 40 is cross-shaped. That is, from the top view of the solid-state image sensor 106 (e.g., FIG. 6), the profile of the light-splitting structure 40 may be formed by two intersecting rectangles. Moreover, in some embodiments, the width W40 of the light-splitting structure 40 is between about 50 nm and about 200 nm. Take the solid-state image sensor 106 (which is shown in FIG. 6) as an example, the width W40 of the light-splitting structure 40 is defined as the short side length of each rectangle.

Figure 7:
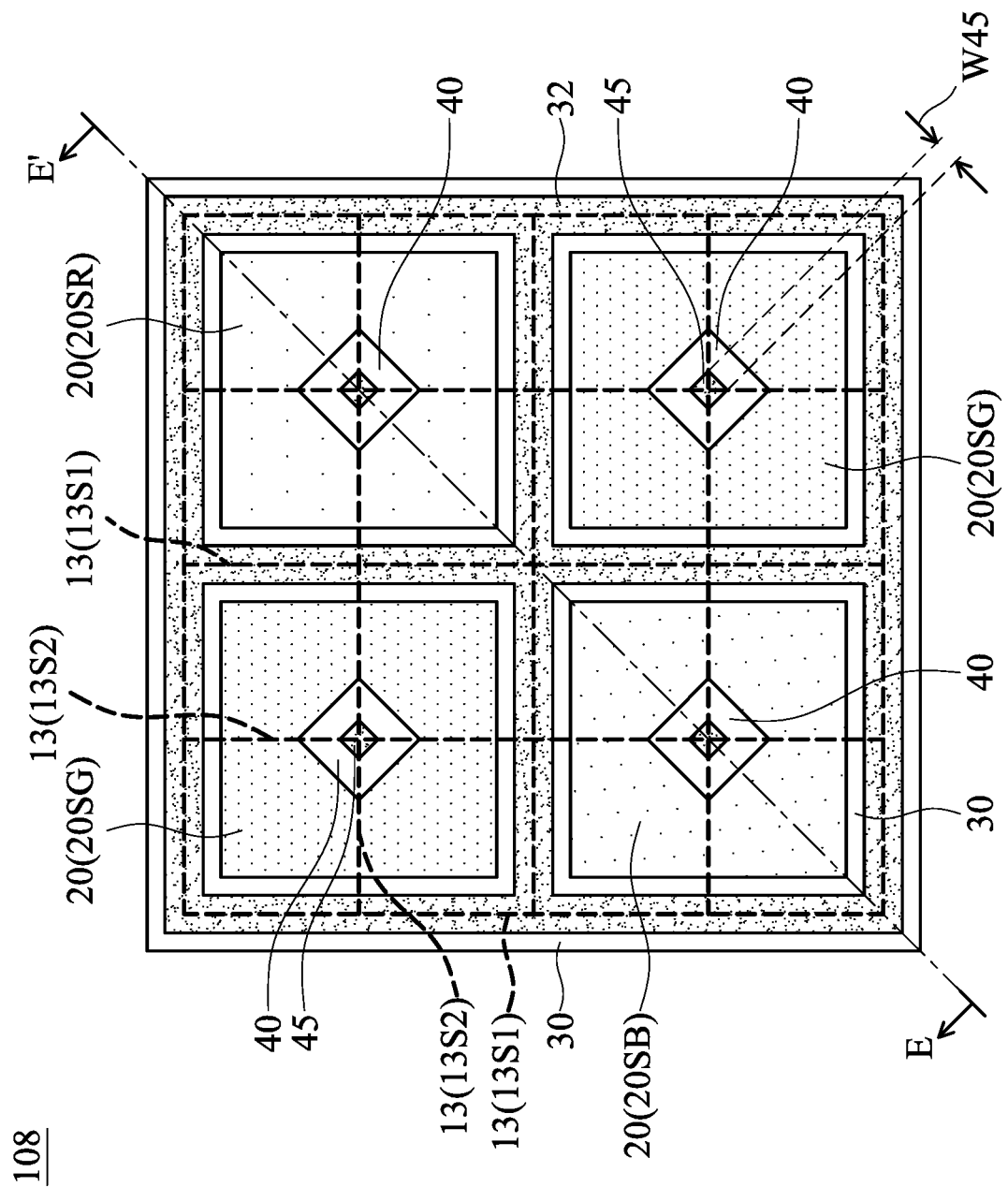
FIG. 7 is a top view illustrating a portion of the solid-state image sensor in accordance with some embodiments of the present disclosure.
Figure 8:
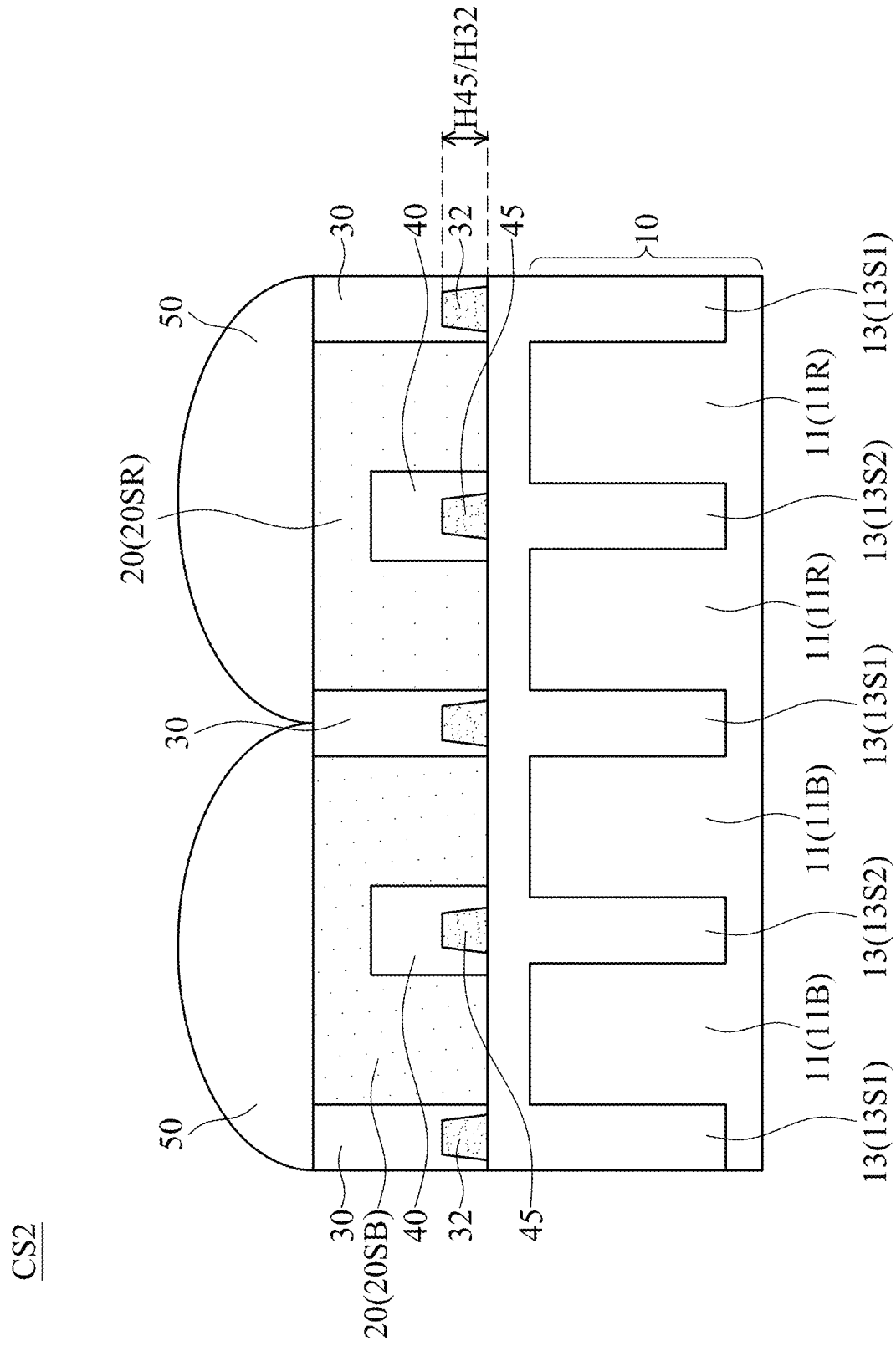
FIG. 8 is a cross-sectional view that may illustrate a portion of the solid-state image sensor in accordance with some embodiments of the present disclosure.

FIG. 7 is a top view illustrating a portion of the solid-state image sensor 108 in accordance with some embodiments of the present disclosure. FIG. 8 is a cross-sectional view CS2 that may illustrate a portion of the solid-state image sensor 108 in accordance with some embodiments of the present disclosure. For example, FIG. 8 may be a cross-sectional view of a portion of the solid-state image sensor 108 along line E-E' in FIG. 7. It should be noted that some components of the solid-state image sensor 108 have been omitted in FIG. 7 and FIG. 8 for the sake of brevity.

Referring to FIG. 7 and FIG. 8, the solid-state image sensor 108 has a similar structure to the solid-state image sensor 100 shown in FIG. 1. The main difference from the solid-state image sensor 100 shown in FIG. 1 is that the solid-state image sensor 108 further includes an inner pillar 45 disposed on the bottom of the light-splitting structure 40. In some embodiments, the number of inner pillars 45 is the same as the number of light-splitting structures 40, so that there are four inner pillars 45 disposed on the bottoms of the corresponding light-splitting structures 40 in FIG. 7, but the present disclosure is not limited thereto. In some other embodiments, the number of inner pillars 45 is different from (less than) the number of light-splitting structures 40, which may be adjusted by actual needs.

In some embodiments, the inner pillar 45 includes non-transparent material. The transmittance of the inner pillar 45 may be less than about 50%, but the present disclosure is not limited thereto. The inner pillar 45 disposed on the bottom of the light-splitting structure 40 may further reduce scattering and crosstalk. The inner pillar 45 may include the same material or similar to the light-shielding layer 32, and may be formed simultaneously with the light-shielding layer 32 by the same process, but the present disclosure is not limited thereto.

For example, the inner pillar 45 may include a metal, such as copper (Cu), silver (Ag), and so on, but the present disclosure is not limited thereto. Alternately, the inner pillar 45 may include a photoresist (e.g., a black photoresist, or any other applicable photoresist which is not transparent), an ink (e.g., a black ink, or any other applicable ink which is not transparent), a molding compound (e.g., a black molding compound, or any other applicable molding compound which is not transparent), a solder mask (e.g., a black solder mask, or any other applicable solder mask which is not transparent), (black-) epoxy polymer, any other applicable material, or a combination thereof.

In some embodiments, from the top view of the solid-state image sensor 108 (e.g., FIG. 7), the profile of the inner pillar 45 is square, but the present disclosure is not limited thereto. Moreover, in some embodiments, the width W45 of the inner pillar 45 is between about 50 nm and about 100 nm. Here, the width W45 of the inner pillar 45 is defined as the shortest distance of two parallel sides of the inner pillar 45. Take the solid-state image sensor 108 (which is shown in FIG. 7) as an example, the width W45 of the inner pillar 45 is defined as the side length of the square.

As shown in FIG. 8, in some embodiments, the height H45 of the inner pillar 45 is equal to the height H32 of the light-shielding layer 32, but the present disclosure is not limited thereto. In some other embodiments, the height H45 of the inner pillar 45 is lower than the height H32 of the light-shielding layer 32. Moreover, in some embodiments, the height H45 of the inner pillar 45 is less than 150 nm.

Figure 9:
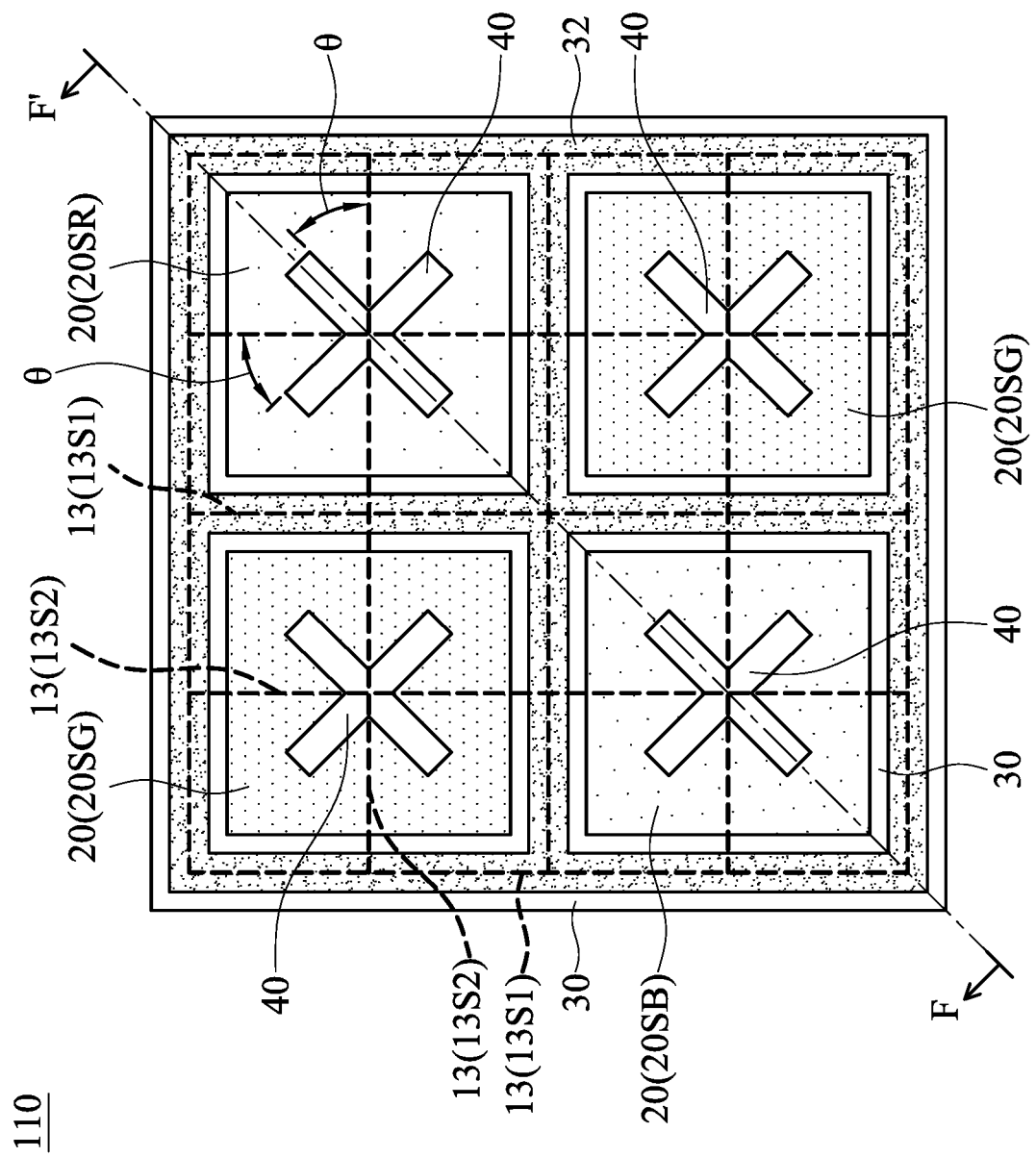
FIG. 9 is a top view illustrating a portion of the solid-state image sensor in accordance with some embodiments of the present disclosure.
Figure 10:
FIG. 10 is a cross-sectional view that may illustrate a portion of the solid-state image sensor in accordance with some embodiments of the present disclosure.

FIG. 9 is a top view illustrating a portion of the solid-state image sensor 110 in accordance with some embodiments of the present disclosure. FIG. 10 is a cross-sectional view CS3 that may illustrate a portion of the solid-state image sensor 110 in accordance with some embodiments of the present disclosure. For example, FIG. 10 may be a cross-sectional view of a portion of the solid-state image sensor 110 along line F-F' in FIG. 9. It should be noted that some components of the solid-state image sensor 110 have been omitted in FIG. 9 and FIG. 10 for the sake of brevity.

Referring to FIG. 9 and FIG. 10, the solid-state image sensor 110 has a similar structure to the solid-state image sensor 106 shown in FIG. 6. That is, from the top view of the solid-state image sensor 110 (e.g., FIG. 9), the profile of the light-splitting structure 40 is cross-shaped. The main difference from the solid-state image sensor 106 shown in FIG. 6 is that from the top view of the solid-state image sensor 110 (e.g., FIG. 9), the light-splitting structure 40 is offset from the corresponding second isolation segments 13S2 by about 45 degrees. In other words, from the top view of the solid-state image sensor 110 (e.g., FIG. 9), the included angle θ between the light-splitting structure 40 and the corresponding second isolation segments 13S2 is about 45 degrees, but the present disclosure is not limited thereto. In some other embodiments, from the top view of the solid-state image sensor 110, the light-splitting structure 40 is offset from the corresponding second isolation segments 13S2 by 0 to about 45 degrees.

Figure 11:
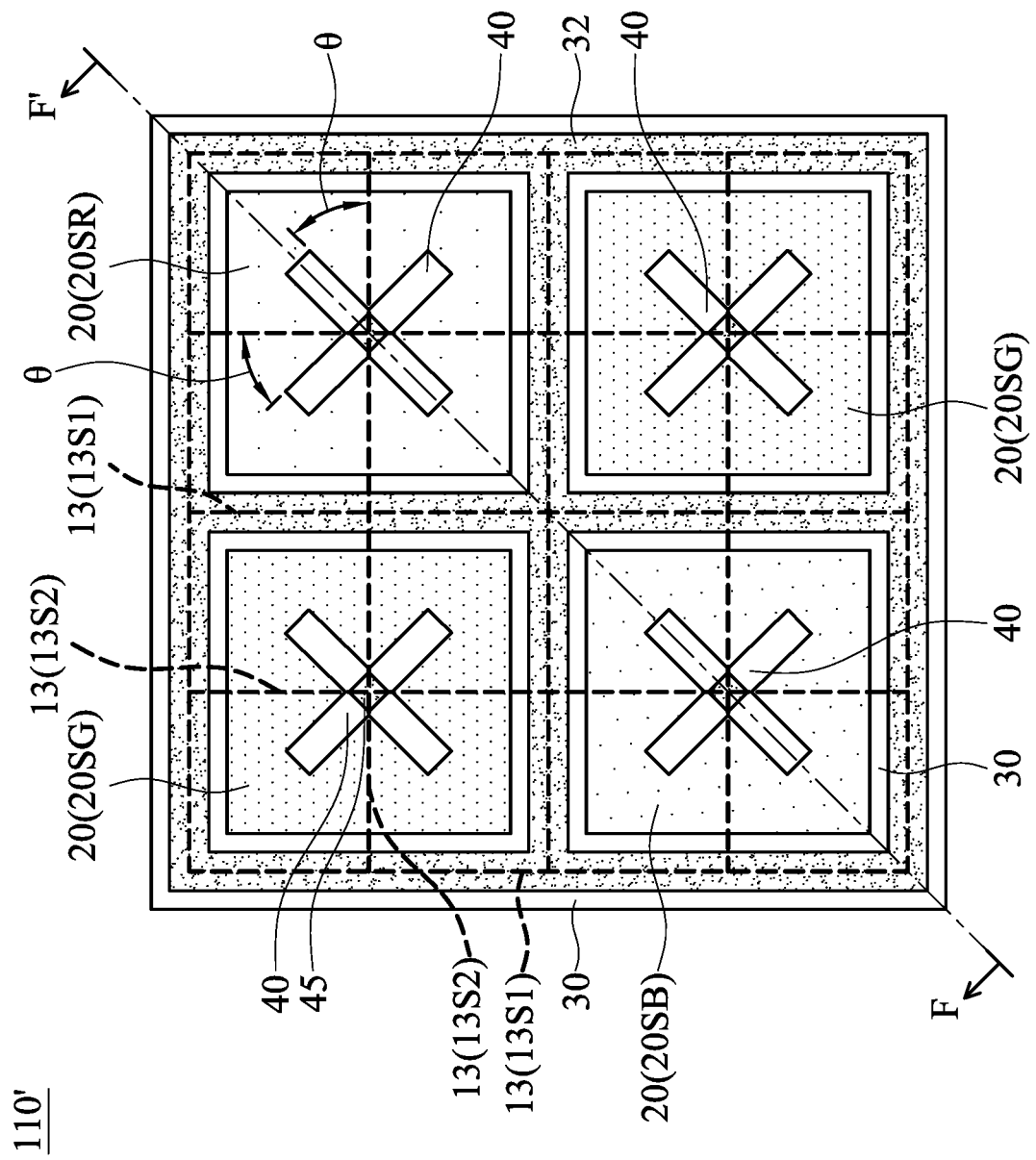
FIG. 11 is a top view illustrating a portion of the solid-state image sensor in accordance with some other embodiments of the present disclosure.
Figure 12:
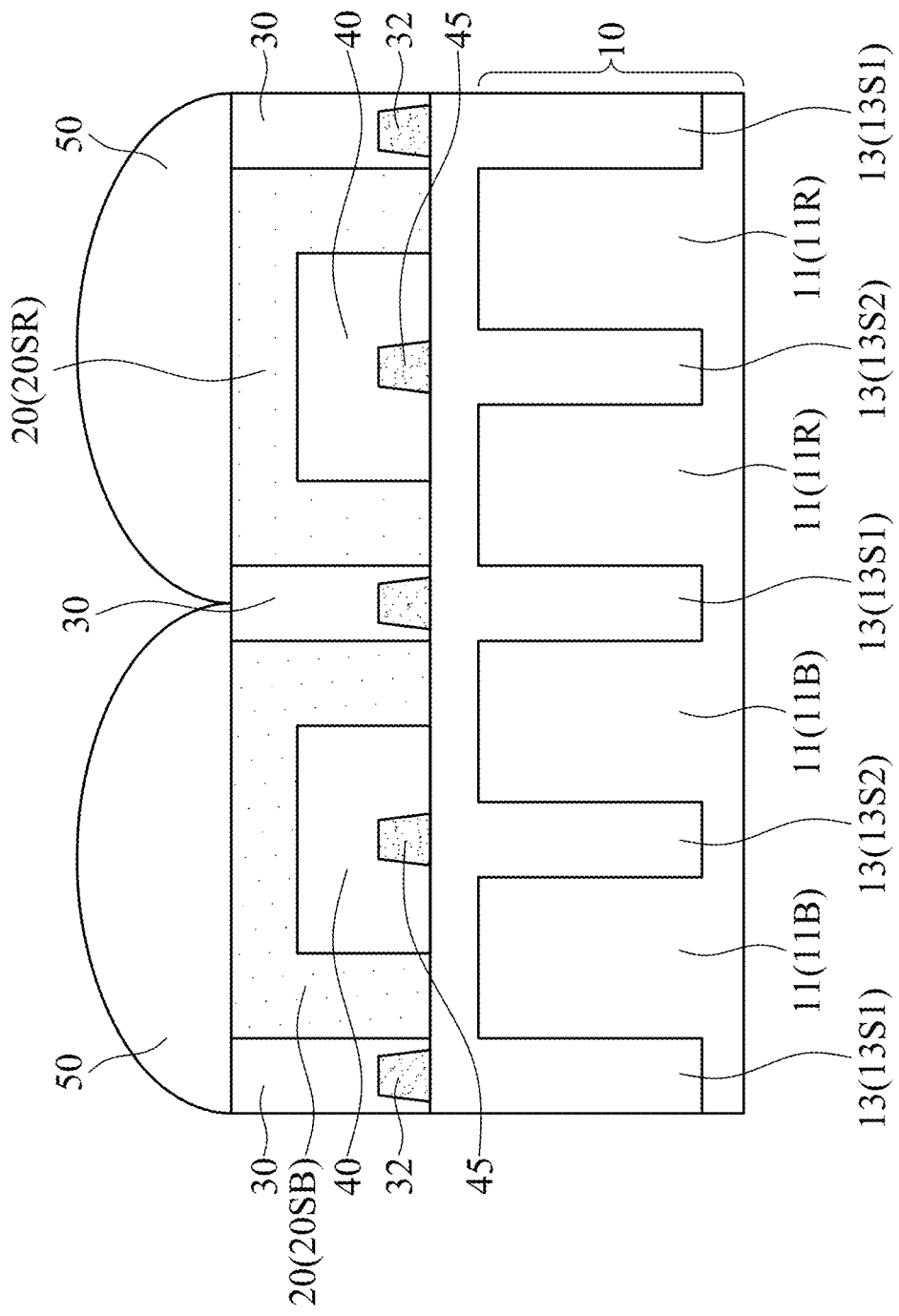
FIG. 12 is a cross-sectional view that may illustrate a portion of the solid-state image sensor in accordance with some other embodiments of the present disclosure.

FIG. 11 is a top view illustrating a portion of the solid-state image sensor 110' in accordance with some other embodiments of the present disclosure. FIG. 12 is a cross-sectional view CS3' that may illustrate a portion of the solid-state image sensor 110' in accordance with some other embodiments of the present disclosure. For example, FIG. 12 may be a cross-sectional view of a portion of the solid-state image sensor 110' along line F-F' in FIG. 11. It should be noted that some components of the solid-state image sensor 110' have been omitted in FIG. 11 and FIG. 12 for the sake of brevity.

Referring to FIG. 11 and FIG. 12, the solid-state image sensor 110' has a similar structure to the solid-state image sensor 110 shown in FIG. 9. The main difference from the solid-state image sensor 110 shown in FIG. 9 is that the solid-state image sensor 110' further includes an inner pillar 45 disposed on the bottom of the light-splitting structure 40. Moreover, from the top view of the solid-state image sensor 110' as shown in FIG. 11, the inner pillar 45 is disposed on the center of the light-splitting structure 40. In this embodiment, the number of inner pillars 45 is the same as the number of light-splitting structures 40, so that there are four inner pillars 45 disposed on the bottoms of the corresponding light-splitting structures 40 in FIG. 11, but the present disclosure is not limited thereto.

Figure 13:
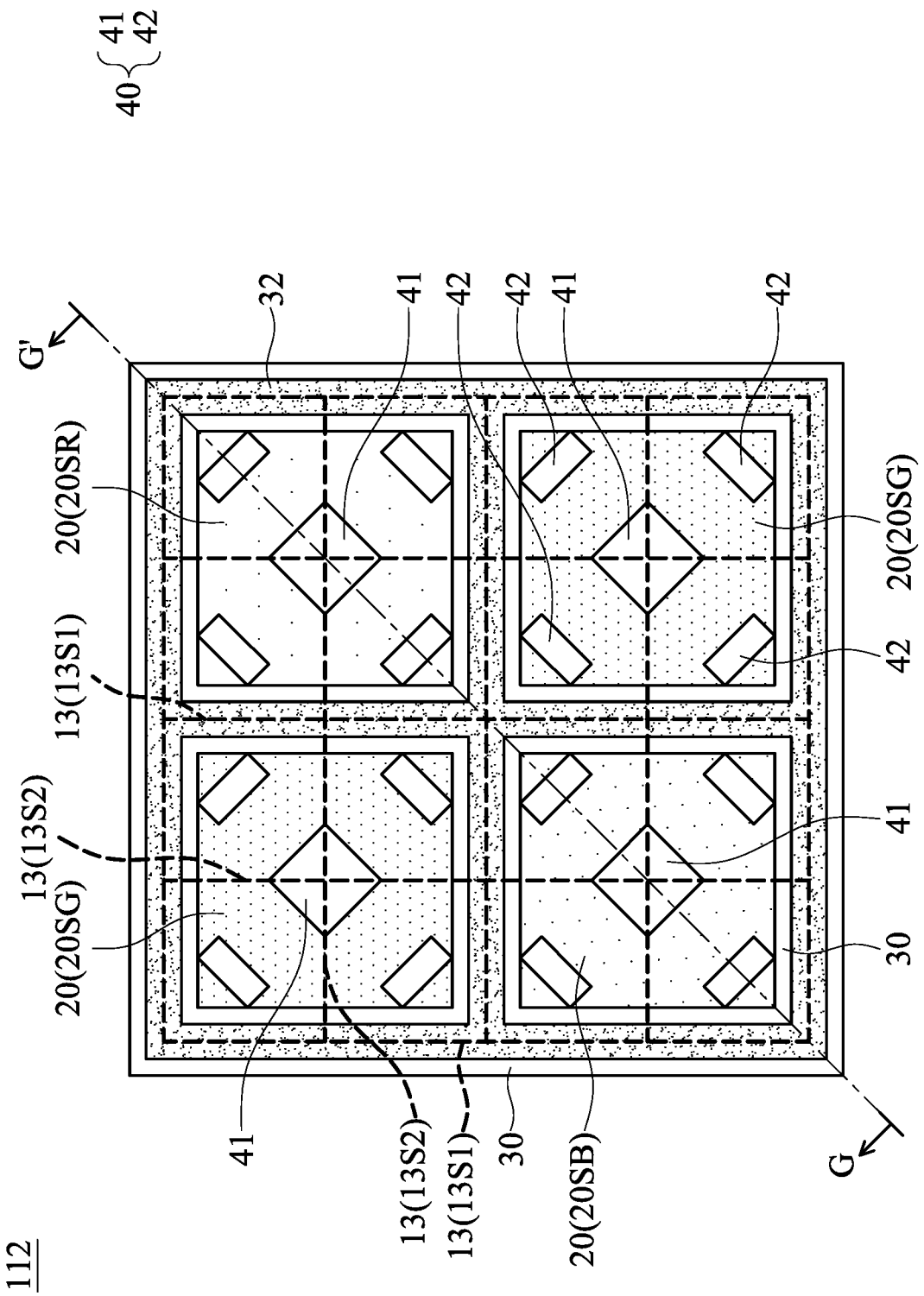
FIG. 13 is a top view illustrating a portion of the solid-state image sensor in accordance with some embodiments of the present disclosure.
Figure 14:
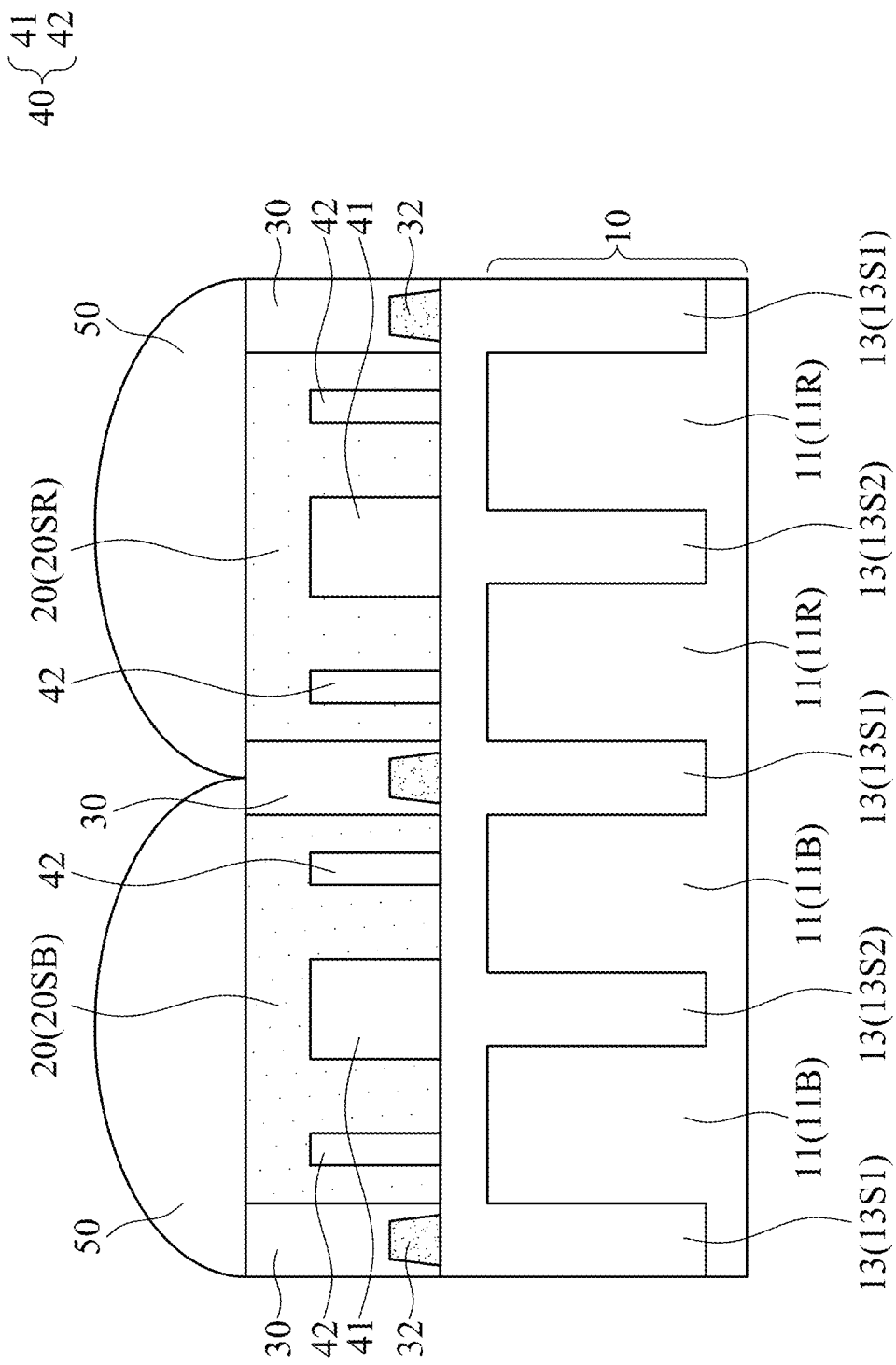
FIG. 14 is a cross-sectional view that may illustrate a portion of the solid-state image sensor in accordance with some embodiments of the present disclosure.

FIG. 13 is a top view illustrating a portion of the solid-state image sensor 112 in accordance with some embodiments of the present disclosure. FIG. 14 is a cross-sectional view CS4 that may illustrate a portion of the solid-state image sensor 112 in accordance with some embodiments of the present disclosure. For example, FIG. 14 may be a cross-sectional view of a portion of the solid-state image sensor 112 along line G-G' in FIG. 13. It should be noted that some components of the solid-state image sensor 112 have been omitted in FIG. 13 and FIG. 14 for the sake of brevity.

Referring to FIG. 13 and FIG. 14, the solid-state image sensor 112 has a similar structure to the solid-state image sensor 100 shown in FIG. 1. The main difference from the solid-state image sensor 100 shown in FIG. 1 is that the light-splitting structure 40 of the solid-state image sensor 112 has a first portion 41 and a second portion 42. As shown in FIG. 13 and FIG. 14, the first portion 41 is disposed on the center of the color filter segment (e.g., red color filter segment 20SR, green color filter segment 20SG, or blue color filter segment 20SB), and the second portion 42 is disposed near at least one corner of the color filter segment. For example, as shown in FIG. 13, there are four portions 42 disposed near four corners in each color filter segment, but the present disclosure is not limited thereto. The number of second portions 42 and the positions of these second portions 42 may be adjusted according to actual needs.

Figure 15:
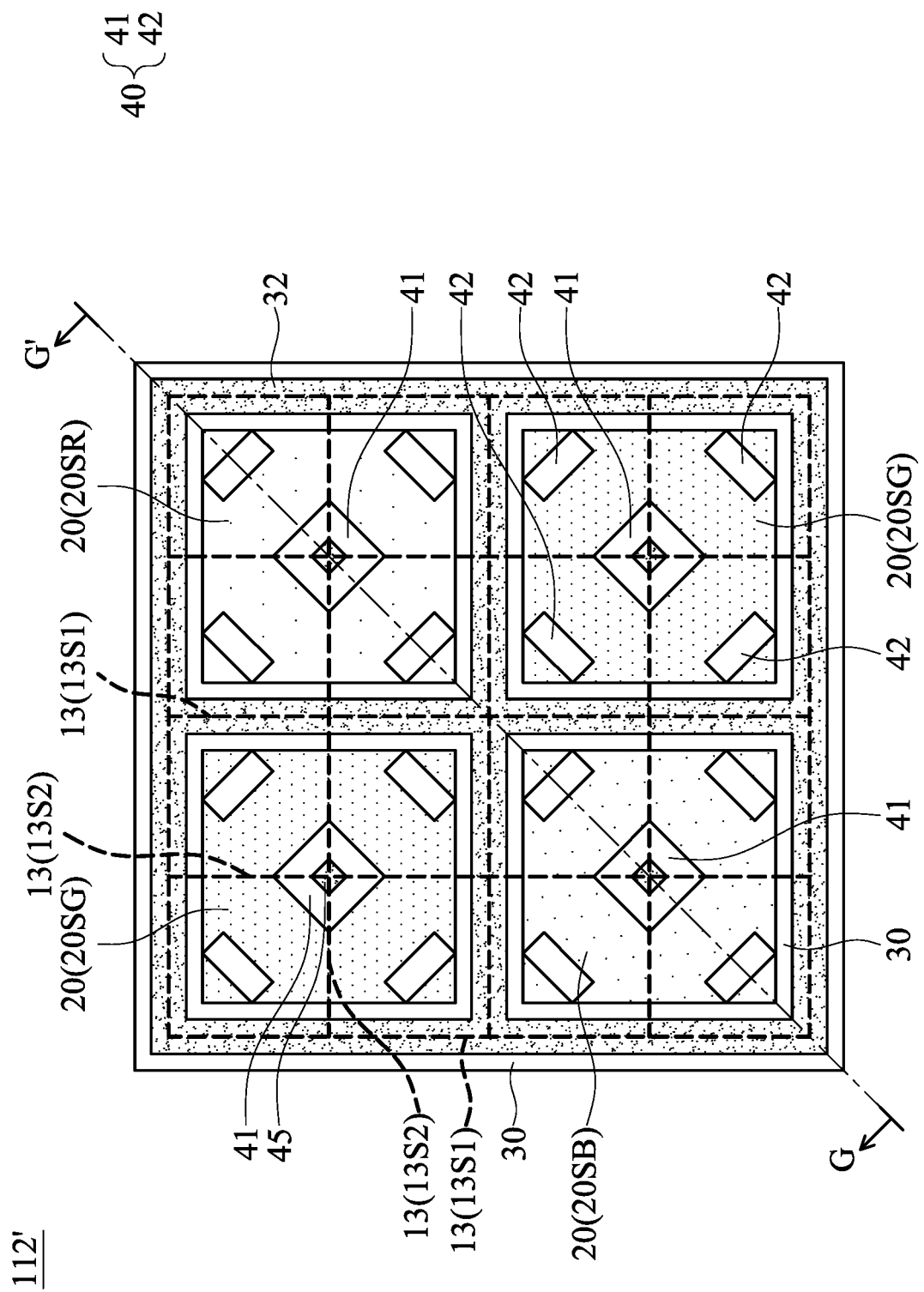
FIG. 15 is a top view illustrating a portion of the solid-state image sensor in accordance with some other embodiments of the present disclosure.
Figure 16:
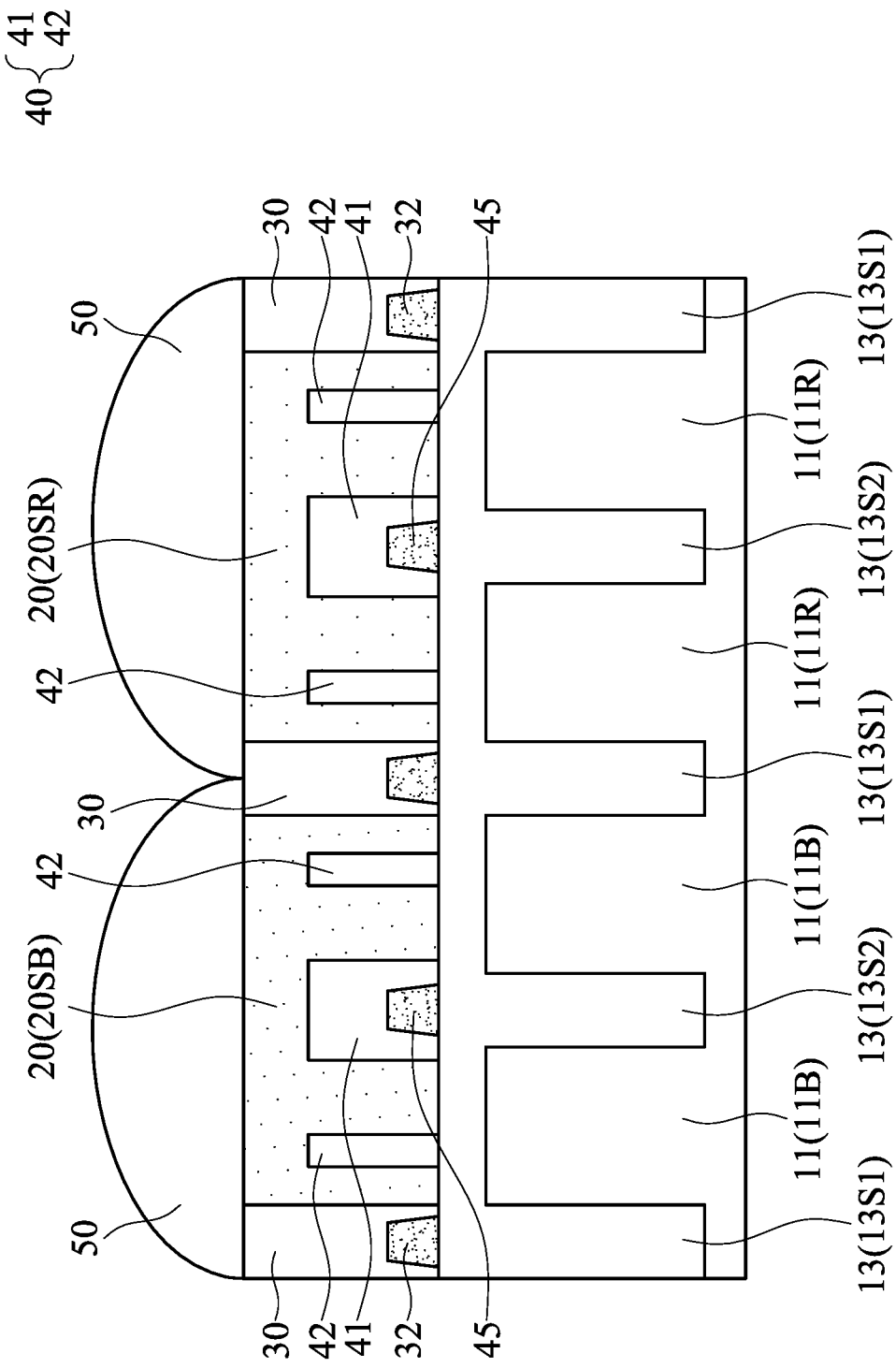
FIG. 16 is a cross-sectional view that may illustrate a portion of the solid-state image sensor in accordance with some other embodiments of the present disclosure.

FIG. 15 is a top view illustrating a portion of the solid-state image sensor 112' in accordance with some other embodiments of the present disclosure. FIG. 16 is a cross-sectional view CS4' that may illustrate a portion of the solid-state image sensor 112' in accordance with some other embodiments of the present disclosure. For example, FIG. 16 may be a cross-sectional view of a portion of the solid-state image sensor 112' along line G-G' in FIG. 15. It should be noted that some components of the solid-state image sensor 112' have been omitted in FIG. 15 and FIG. 16 for the sake of brevity.

Referring to FIG. 15 and FIG. 16, the solid-state image sensor 112' has a similar structure to the solid-state image sensor 112 shown in FIG. 13. The main difference from the solid-state image sensor 112 shown in FIG. 13 is that the solid-state image sensor 112' further includes an inner pillar 45 disposed on the bottom of the light-splitting structure 40. In more detail, the inner pillar 45 disposed on the bottom of the first portion 41 of the light-splitting structure 40. Moreover, from the top view of the solid-state image sensor 112' as shown in FIG. 15, the inner pillar 45 is disposed on the center of first portion 41 of the light-splitting structure 40. In this embodiment, the number of inner pillars 45 is the same as the number of first portions 41 of the light-splitting structure 40, so that there are four inner pillars 45 disposed on the bottoms of the corresponding first portions 41 in FIG. 15, but the present disclosure is not limited thereto.

Figure 17:
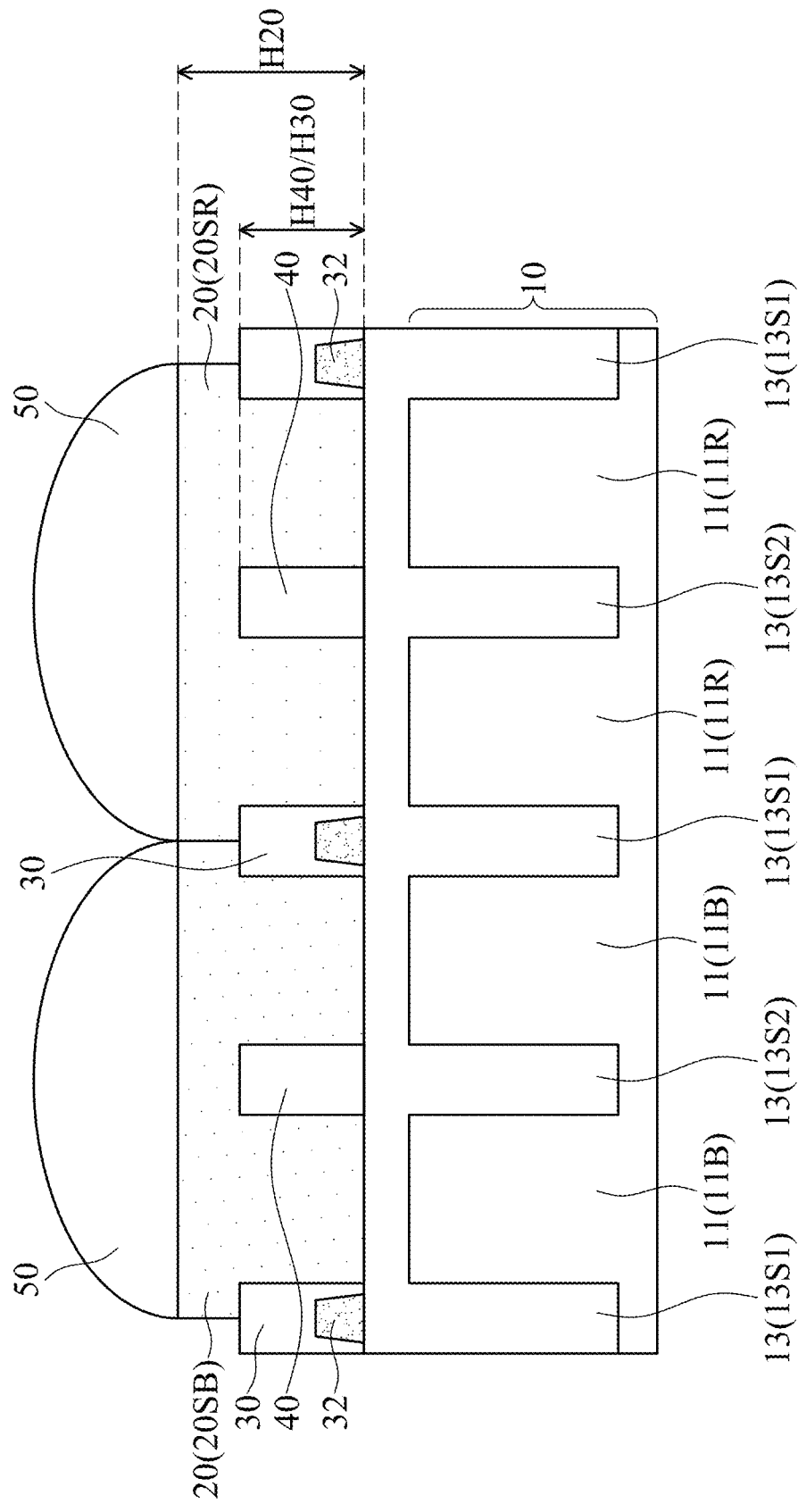
FIG. 17 is a cross-sectional view that may illustrate a portion of the solid-state image sensor in accordance with some embodiments of the present disclosure.

In the foregoing embodiments, the height H20 of the color filter layer 20 is equal to the height H30 of the grid structure 30, and the height H40 of the light-splitting structure 40 is lower than the height H20 of the color filter layer 20 (or the height H30 of the grid structure 30), but the present disclosure is not limited thereto. FIG. 17 is a cross-sectional view CS5 that may illustrate a portion of the solid-state image sensor in accordance with some embodiments of the present disclosure. For example, the cross-sectional view CS5 shown in FIG. 17 may replace the cross-sectional view CS1 shown in FIG. 2 as the cross-sectional view of the solid-state sensing devices 100, 102, 104, or 106, but the present disclosure is not limited thereto.

In the embodiment shown in FIG. 17, the height H40 of the light-splitting structure 40 is equal to the height H30 of the grid structure 30, and the height H40 of the light-splitting structure 40 (or the height H30 of the grid structure 30) is lower than the height H20 of the color filter layer 20, but the present disclosure is not limited thereto.

Figure 18:
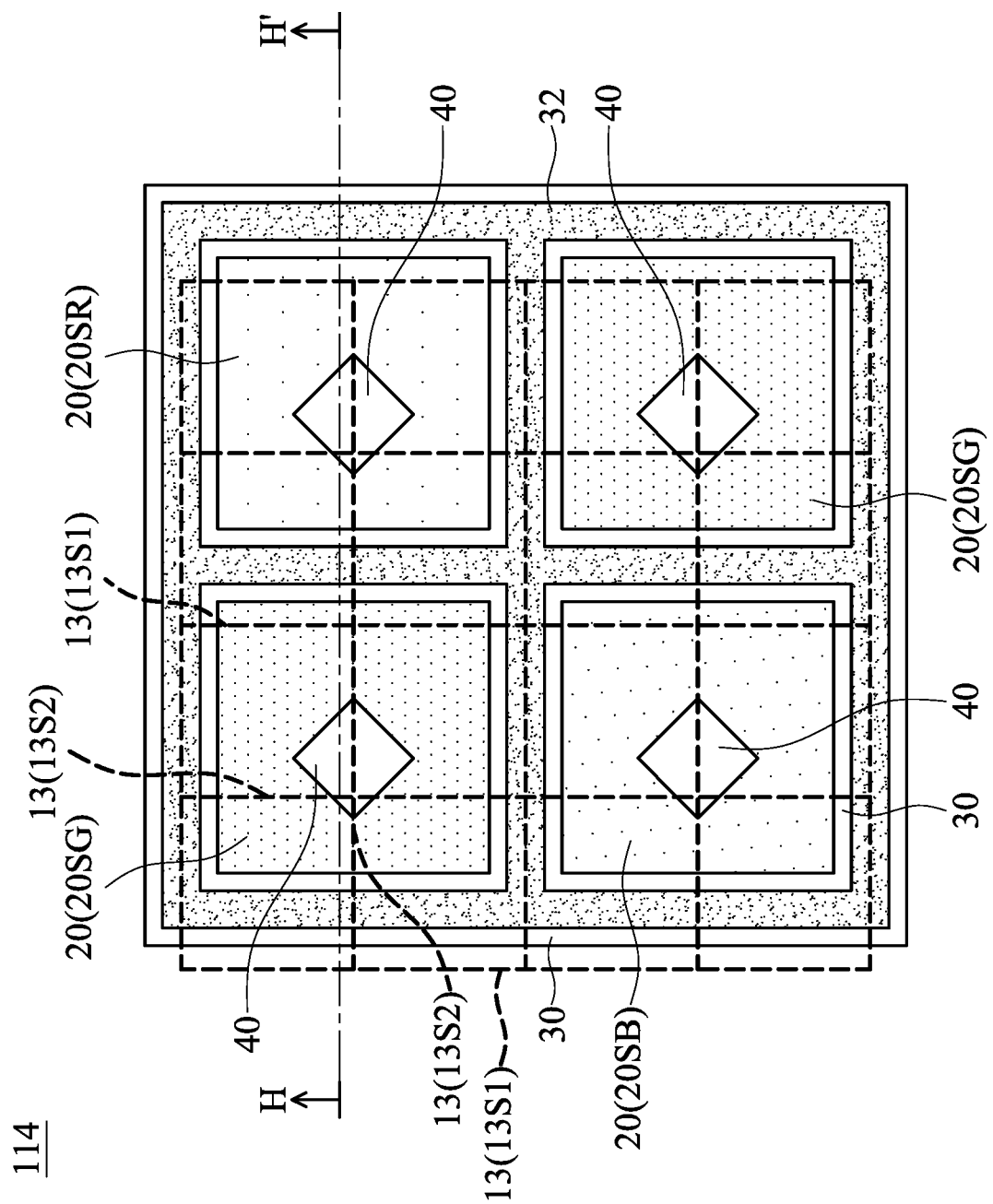
FIG. 18 is a top view illustrating a portion of the solid-state image sensor in accordance with some embodiments of the present disclosure.
Figure 19:
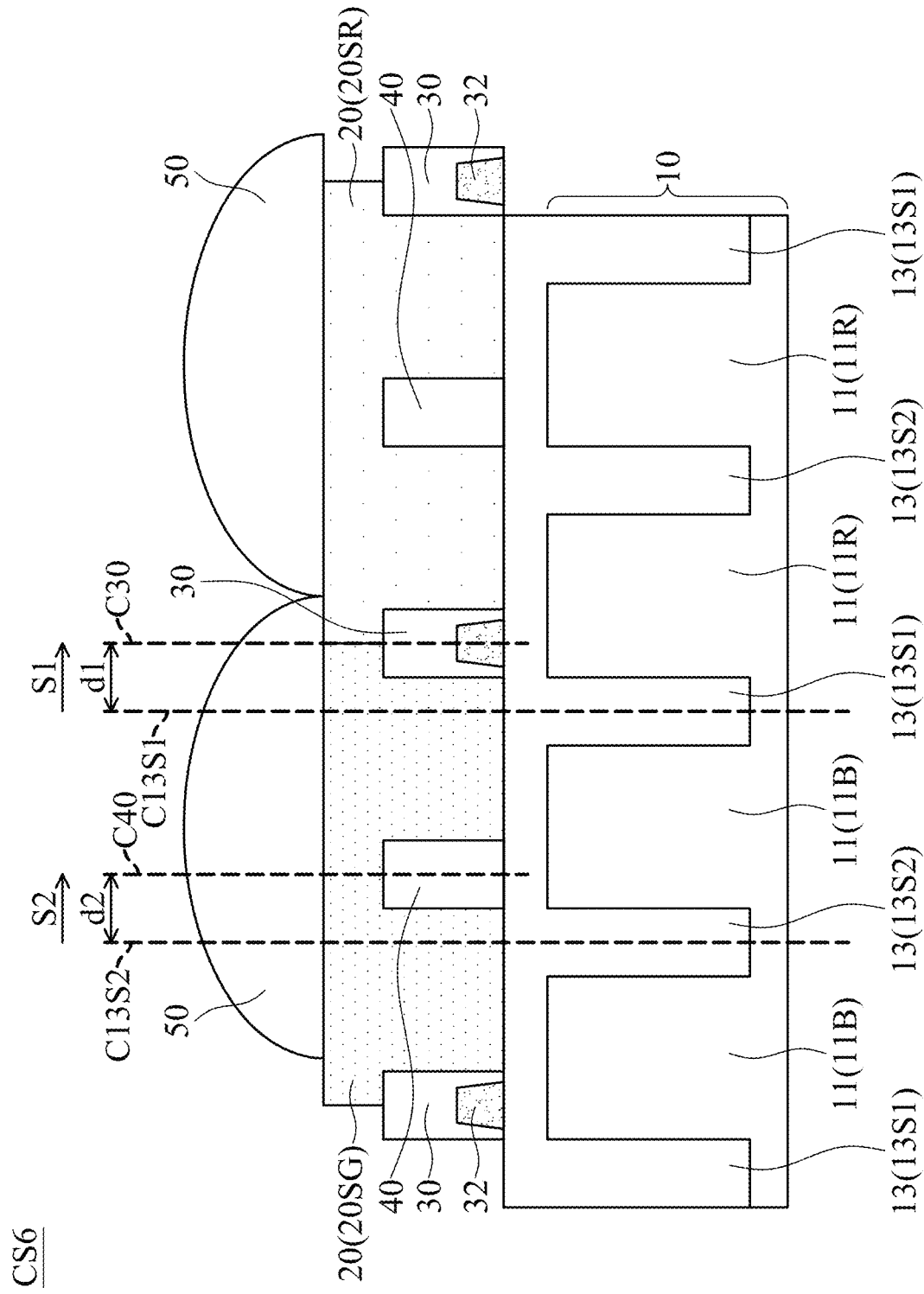
FIG. 19 is a cross-sectional view that may illustrate a portion of the solid-state image sensor in accordance with some embodiments of the present disclosure.

FIG. 18 is a top view illustrating a portion of the solid-state image sensor 114 in accordance with some embodiments of the present disclosure. FIG. 19 is a cross-sectional view CS6 that may illustrate a portion of the solid-state image sensor 114 in accordance with some embodiments of the present disclosure. For example, FIG. 19 may be a cross-sectional view of a portion of the solid-state image sensor 114 along line H-H' in FIG. 18. It should be noted that some components of the solid-state image sensor 114 have been omitted in FIG. 18 and FIG. 19 for the sake of brevity.

Referring to FIG. 18 and FIG. 19, the solid-state image sensor 114 has a similar structure to the solid-state image sensor 100 shown in FIG. 1 and FIG. 2. The main difference from the solid-state image sensor 100 shown in FIG. 1 and FIG. 2 is that in the solid-state image sensor 114, the grid structure 30 has a shift S1 with respect to the corresponding first isolation segments 13S1, and the light-splitting structure 40 has a shift S2 with respect to the corresponding second isolation segment 13S2.

Here, the shift S1 may be defined as the distance d1 between the central axis C30 of the grid structure 30 and the central axis C13S1 of the corresponding first isolation segments 13S1, and the shift S2 may be defined as the distance d2 between the central axis C40 of the light-splitting structure 40 and the central axis C13S2 of the corresponding second isolation segment 13S2. In the embodiment shown in FIG. 18 and FIG. 19, the shift S1 is the same as the shift S2. That is, the distance d1 between the central axis C30 of the grid structure 30 and the central axis C13S1 of the corresponding first isolation segments 13S1 is equal to the distance d2 between the central axis C40 of the light-splitting structure 40 and the central axis C13S2 of the corresponding second isolation segment 13S2, but the present disclosure is not limited thereto.

In some embodiments, the solid-state image sensor 100 shown in FIG. 1 and FIG. 2 and the solid-state image sensor 114 shown in FIG. 18 and FIG. 19 may be different regions of the same solid-state image sensor. For example, the solid-state image sensor 100 shown in FIG. 1 and FIG. 2 may be the central region of the solid-state image sensor, and the solid-state image sensor 114 shown in FIG. 18 and FIG. 19 may be the peripheral (edge) region of the solid-state image sensor, but the present disclosure is not limited thereto.

Figure 20:
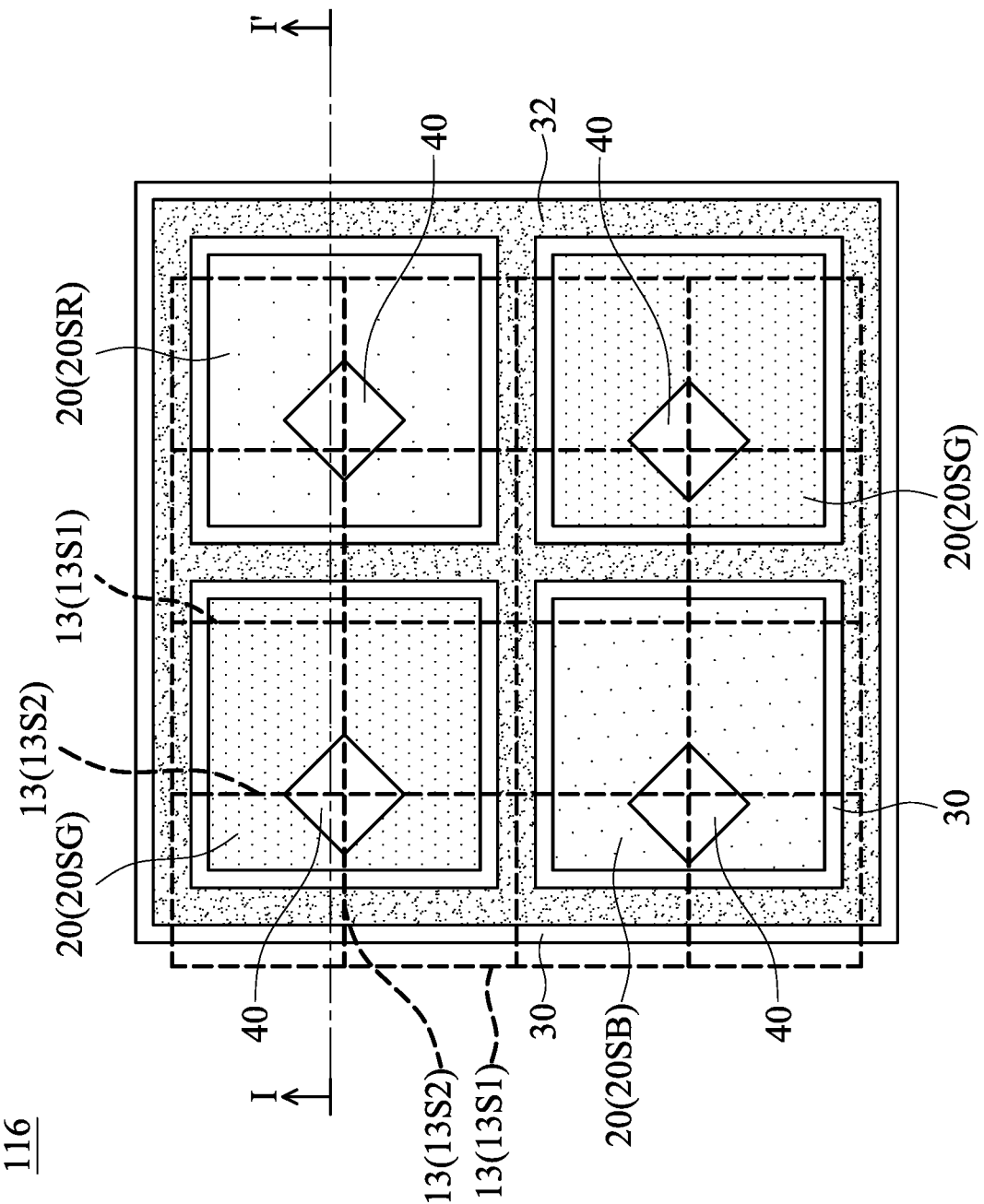
FIG. 20 is a top view illustrating a portion of the solid-state image sensor in accordance with some embodiments of the present disclosure.
Figure 21:
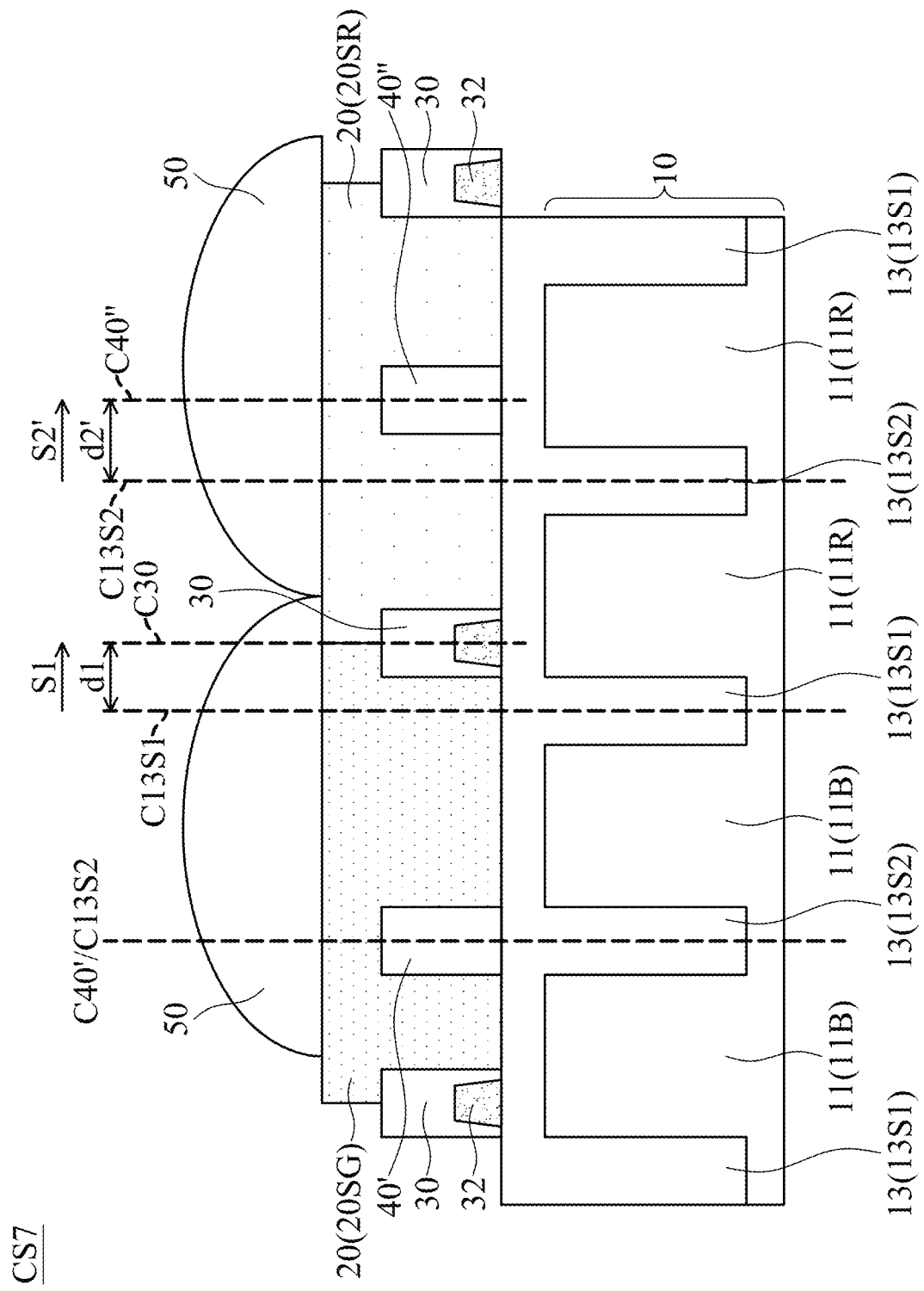
FIG. 21 is a cross-sectional view that may illustrate a portion of the solid-state image sensor in accordance with some embodiments of the present disclosure.

FIG. 20 is a top view illustrating a portion of the solid-state image sensor 116 in accordance with some embodiments of the present disclosure. FIG. 21 is a cross-sectional view CS7 that may illustrate a portion of the solid-state image sensor 116 in accordance with some embodiments of the present disclosure. For example, FIG. 21 may be a cross-sectional view of a portion of the solid-state image sensor 116 along line I-I' in FIG. 20. It should be noted that some components of the solid-state image sensor 116 have been omitted in FIG. 20 and FIG. 21 for the sake of brevity.

In the solid-state image sensor 116, the grid structure 30 has a shift S1 with respect to the corresponding first isolation segments 13S1, one light-splitting structure 40' does not have a shift with respect to the corresponding second isolation segment 13S2, and another light-splitting structure 40" has a shift S2' with respect to the corresponding second isolation segment 13S2. That is, the distance between the central axis C40' of the light-splitting structure 40' and the central axis C13S2 of the corresponding second isolation segment 13S2 is 0, the distance d2' between the central axis C40" of the light-splitting structure 40" and the central axis C13S2 of the corresponding second isolation segment 13S2 is greater than 0. In other words, the shift S2/S2' may be variable. Moreover, in the embodiment shown in FIG. 20 and FIG. 21, the shift S1 is different from the shift S2'.

In the foregoing embodiments (e.g., FIG. 1, 4-7, 9, 11, 13, 15, 18, or 20), one red color filter segment 20SR, two green color filter segments 20SG, and one blue color filter segment 20SB of the color filter layer 20 form a 2×2 array, which may be referred to as a 4C quadratic photo diodes (QPD) or dual photo diodes (DPD), but the present disclosure is not limited thereto.

Figure 22:
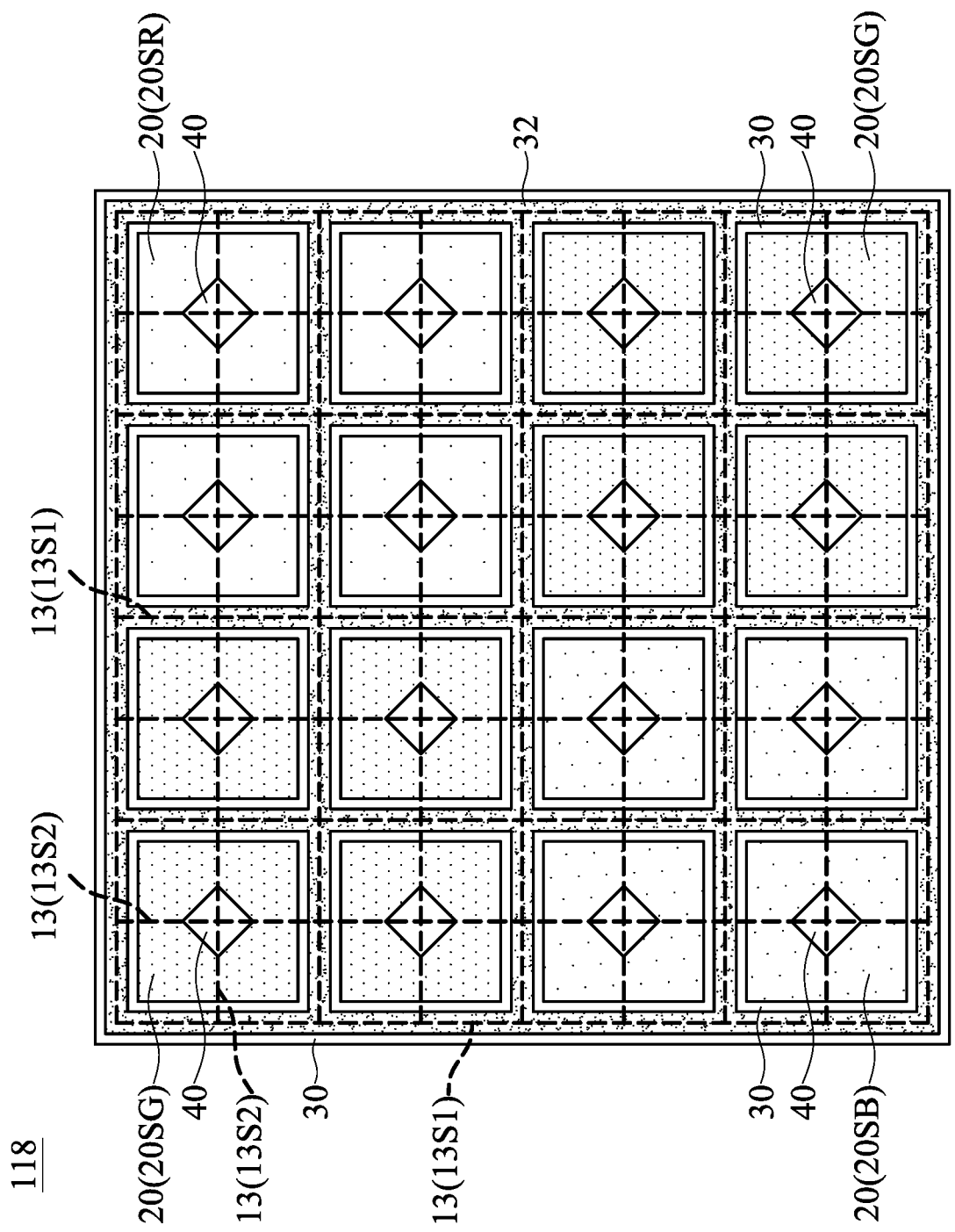
FIG. 22 is a top view illustrating a portion of the solid-state image sensor in accordance with some other embodiments of the present disclosure.

FIG. 22 is a top view illustrating a portion of the solid-state image sensor 118 in accordance with some other embodiments of the present disclosure. Referring to FIG. 22, eight green color filter segments 20SG form two 2×2 arrays, four red color filter segments 20SR form a 2×2 array, and four blue color filter segments 20SB form a 2×2 array. As shown in FIG. 22, the light-splitting structures 40 are disposed in all color filter segments, but the present disclosure is not limited thereto. In some other embodiments, the light-splitting structures 40 may be disposed merely in some color filter segments.

Moreover, the forgoing color filter segments (i.e., red color filter segments 20SR, green color filter segments 20SG, and blue color filter segments 20SB) form a 4×4 array, which may be referred to as a 16C quadratic photo diodes (QPD) or dual photo diodes (DPD), but the present disclosure is not limited thereto. The number and arrangement of color filter segments may be adjusted according to the actual needs.

In the foregoing embodiments, the light-splitting structures 40 are disposed in all color filter segments, but the present disclosure is not limited thereto. FIGS. 23A-23F are top views illustrating a portion of the solid-state image sensors 120-130 in accordance with some other embodiments of the present disclosure. Similarly, some components of the solid-state image sensor 120-130 have been omitted in FIGS. 23A-23F for the sake of brevity.

Figures 23A, 23B:
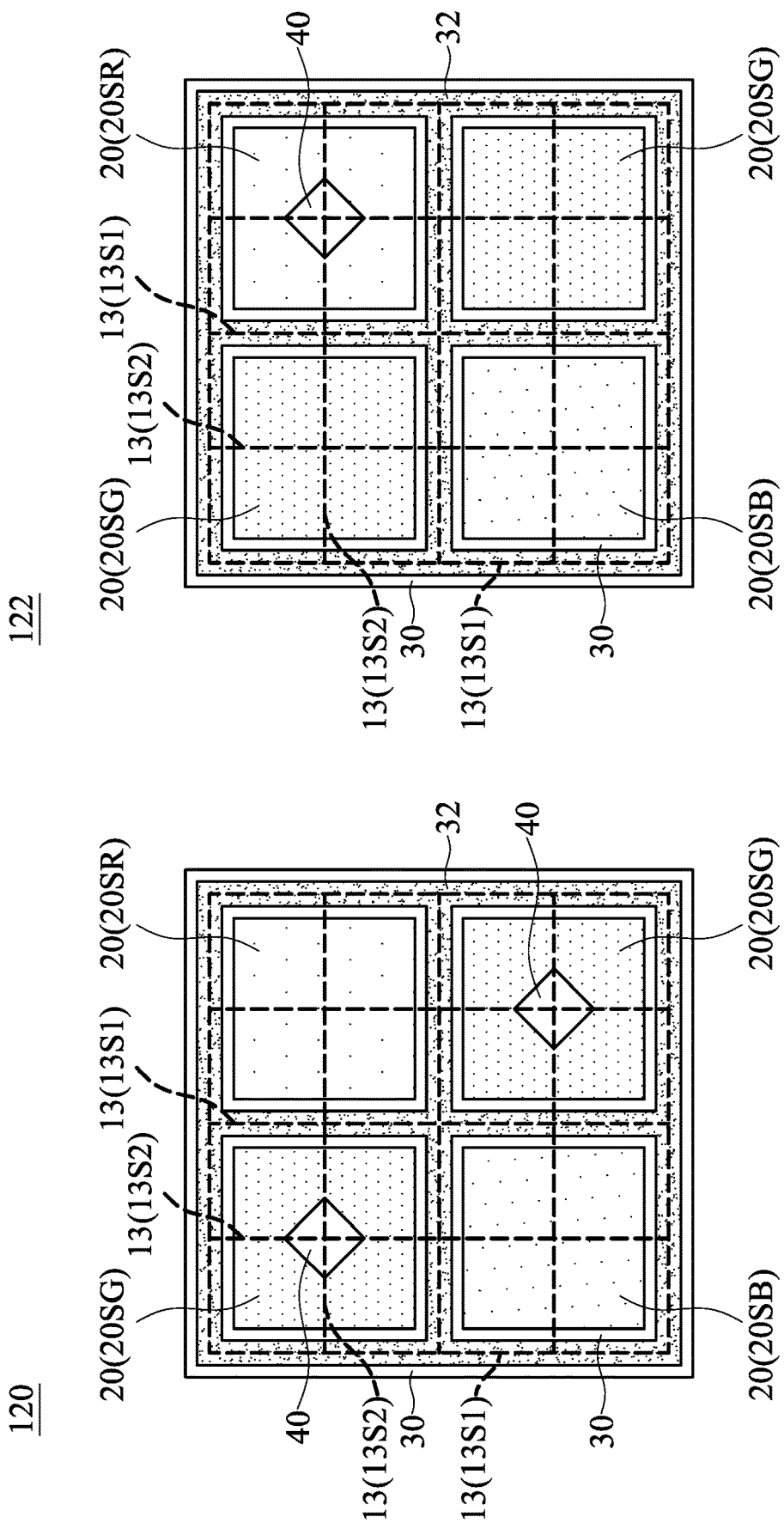
Figures 23C, 23D:
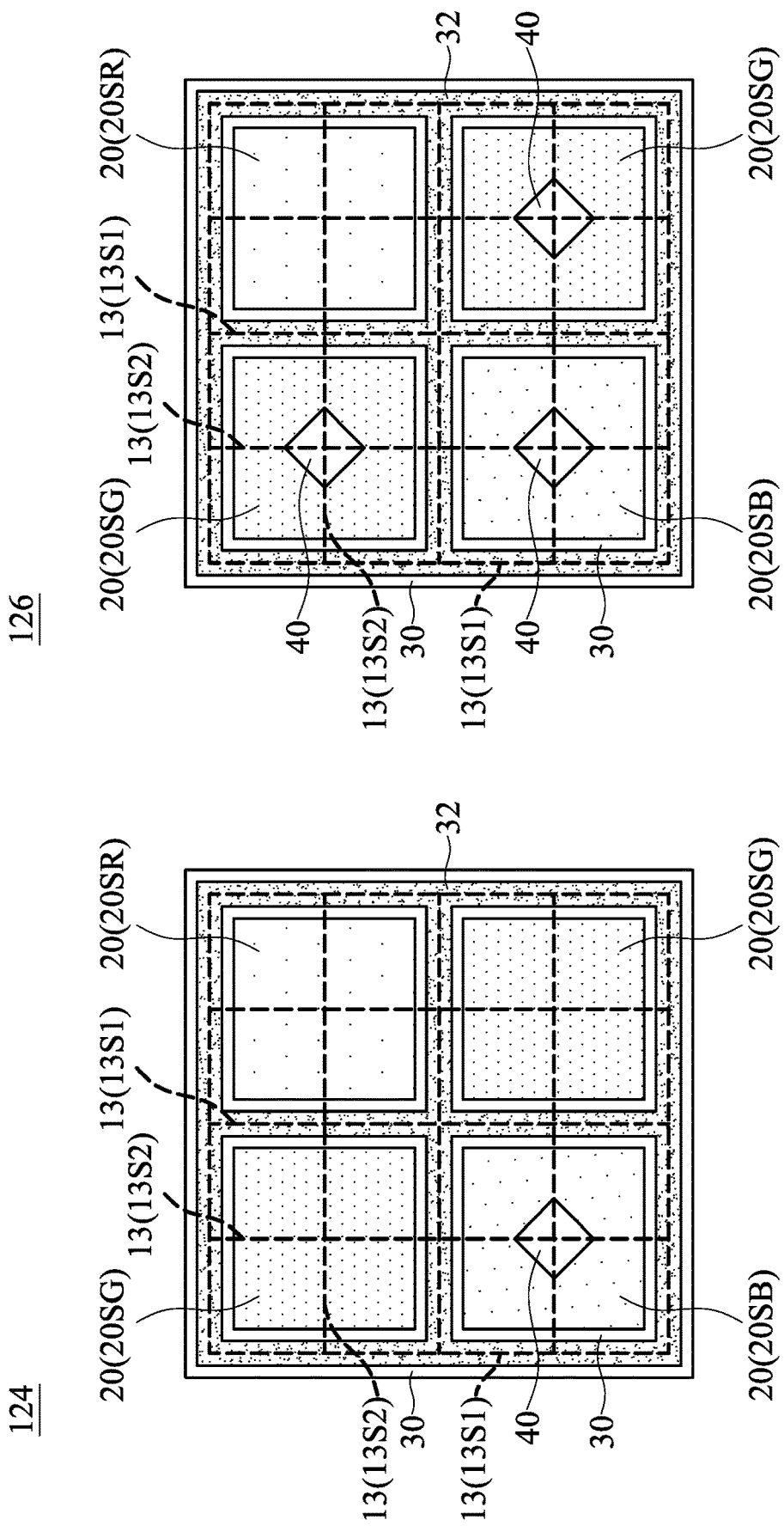

As shown in FIG. 23A, two light-splitting structures 40 are disposed in two green color filter segments 20S. As shown in FIG. 23B, one light-splitting structure 40 is disposed in one red color filter segment 20R. As shown in FIG. 23C, one light-splitting structure 40 is disposed in one blue color filter segment 20B. As shown in FIG. 23D, three light-splitting structures 40 are disposed in two green color filter segments 20S and one blue color filter segment 20B. As shown in FIG. 23E, three light-splitting structures 40 are disposed in two green color filter segments 20S and one red color filter segment 20R. As shown in FIG. 23F, two light-splitting structures 40 are disposed in one red color filter segment 20R and one blue color filter segment 20B.

Figure 24:
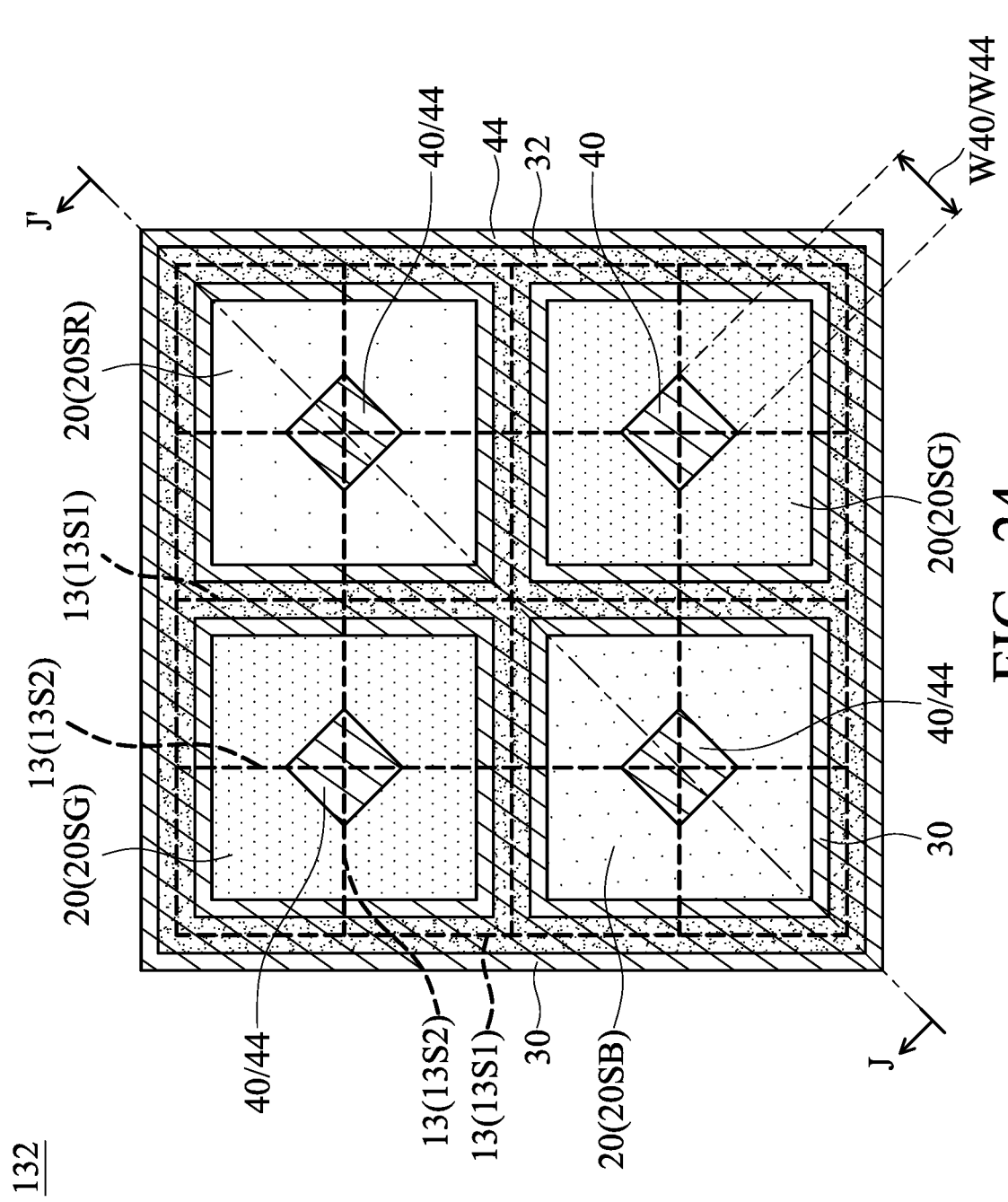
FIG. 24 is a top view illustrating a portion of the solid-state image sensor in accordance with some embodiments of the present disclosure.
Figure 25:
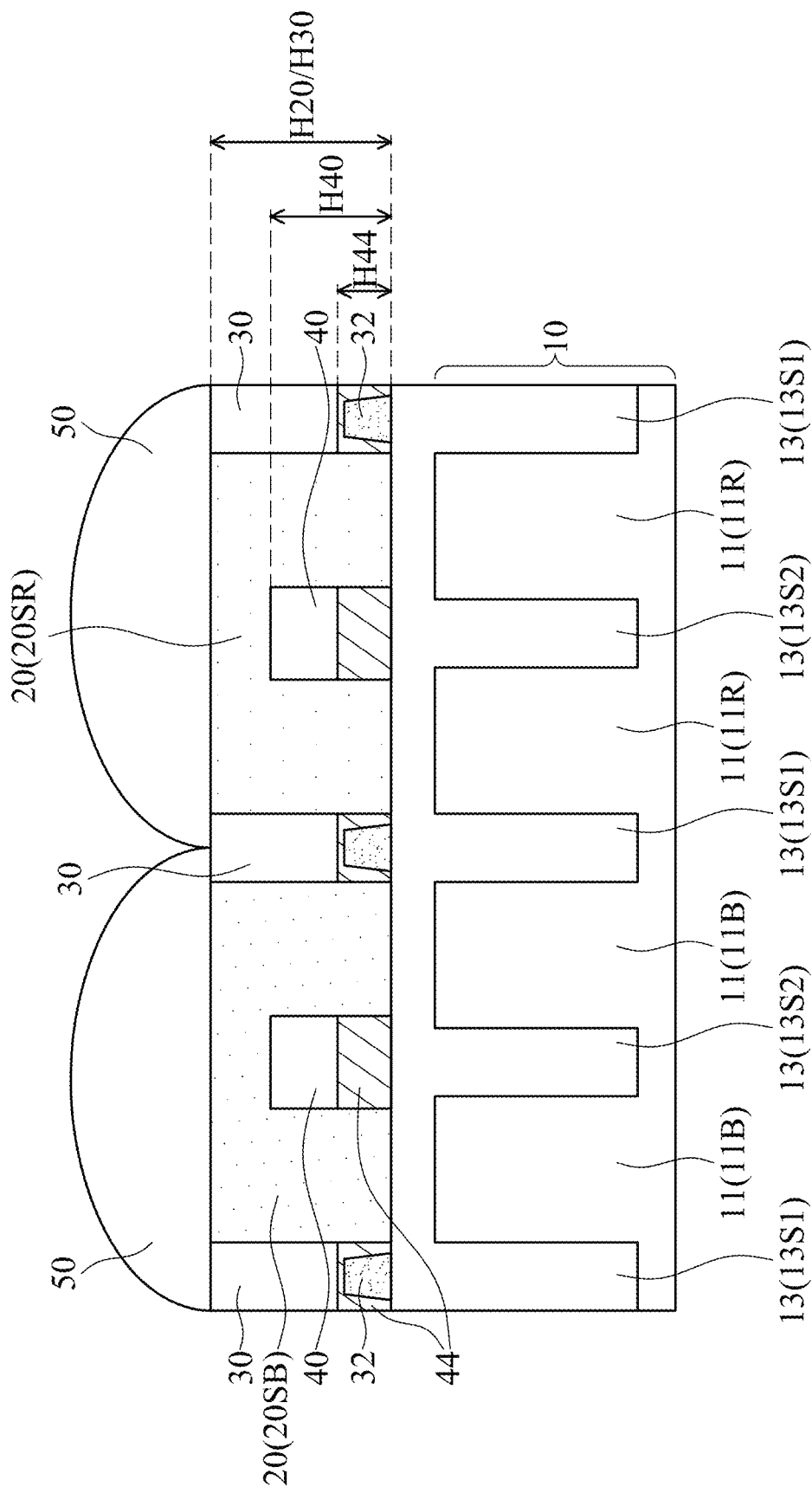
FIG. 25 is a cross-sectional view that may illustrate a portion of the solid-state image sensor in accordance with some embodiments of the present disclosure.

FIG. 24 is a top view illustrating a portion of the solid-state image sensor 132 in accordance with some embodiments of the present disclosure. FIG. 25 is a cross-sectional view CS8 that may illustrate a portion of the solid-state image sensor 132 in accordance with some embodiments of the present disclosure. For example, FIG. 25 may be a cross-sectional view of a portion of the solid-state image sensor 132 along line J-J' in FIG. 24. It should be noted that some components of the solid-state image sensor 132 have been omitted in FIG. 24 and FIG. 25 for the sake of brevity.

Referring to FIG. 24 and FIG. 25, the solid-state image sensor 132 has a similar structure to the solid-state image sensor 100 shown in FIG. 1. The main difference from the solid-state image sensor 100 shown in FIG. 1 is that the solid-state image sensor 132 further includes an auxiliary light-splitting structure 44 disposed on the bottom of the light-splitting structure 40. The auxiliary light-splitting structure 44 may include a transparent dielectric material, but the present disclosure is not limited thereto. In some embodiments, the auxiliary light-splitting structure 44 includes at least one material that is different from the light-splitting structure 40, and the refractive index of the auxiliary light-splitting structure 44 is between about 1 and about 1.65.

In some embodiments, from the top view of the solid-state image sensor 132 (e.g., FIG. 24), the profile of the auxiliary light-splitting structure 44 is square, but the present disclosure is not limited thereto. In other words, from the top view of the solid-state image sensor 132, the profile of the auxiliary light-splitting structure 44 may be the same as or similar to the profile of the light-splitting structure 40, but the present disclosure is not limited thereto. Moreover, in some embodiments, the width W44 of the auxiliary light-splitting structure 44 is equal to or greater than the width W40 of the light-splitting structure 40. For example, the width W44 of the auxiliary light-splitting structure 44 may be between about 70 nm and about 300 nm. Here, the width W44 of the auxiliary light-splitting structure 44 is defined as the shortest distance of two parallel sides of the auxiliary light-splitting structure 44. Take the solid-state image sensor 132 (which is shown in FIG. 24) as an example, the width W44 of the auxiliary light-splitting structure 44 is defined as the side length of the square.

As shown in FIG. 25, in some embodiments, the height H44 of the auxiliary light-splitting structure 44 is between about 50 nm and about 350 nm. Moreover, as shown in FIG. 24 and FIG. 25, in some embodiments, the auxiliary light-splitting structure 44 is further disposed on the bottom of the grid structure 30. That is, the auxiliary light-splitting structure 44 may cover at least a portion of the light-shielding layer 32, but the present disclosure is not limited thereto.

Figure 26:
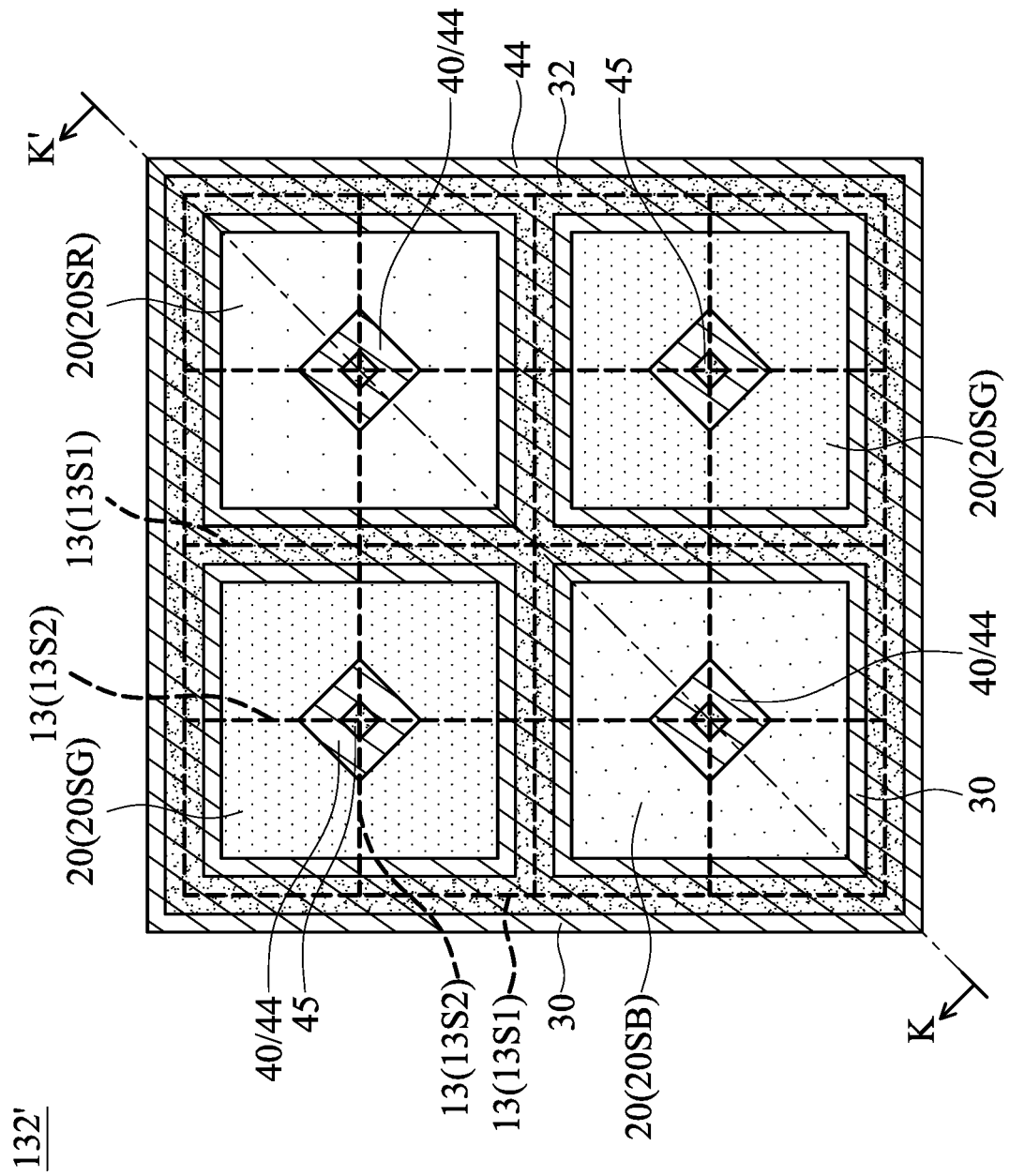
FIG. 26 is a top view illustrating a portion of the solid-state image sensor in accordance with some embodiments of the present disclosure.
Figure 27:
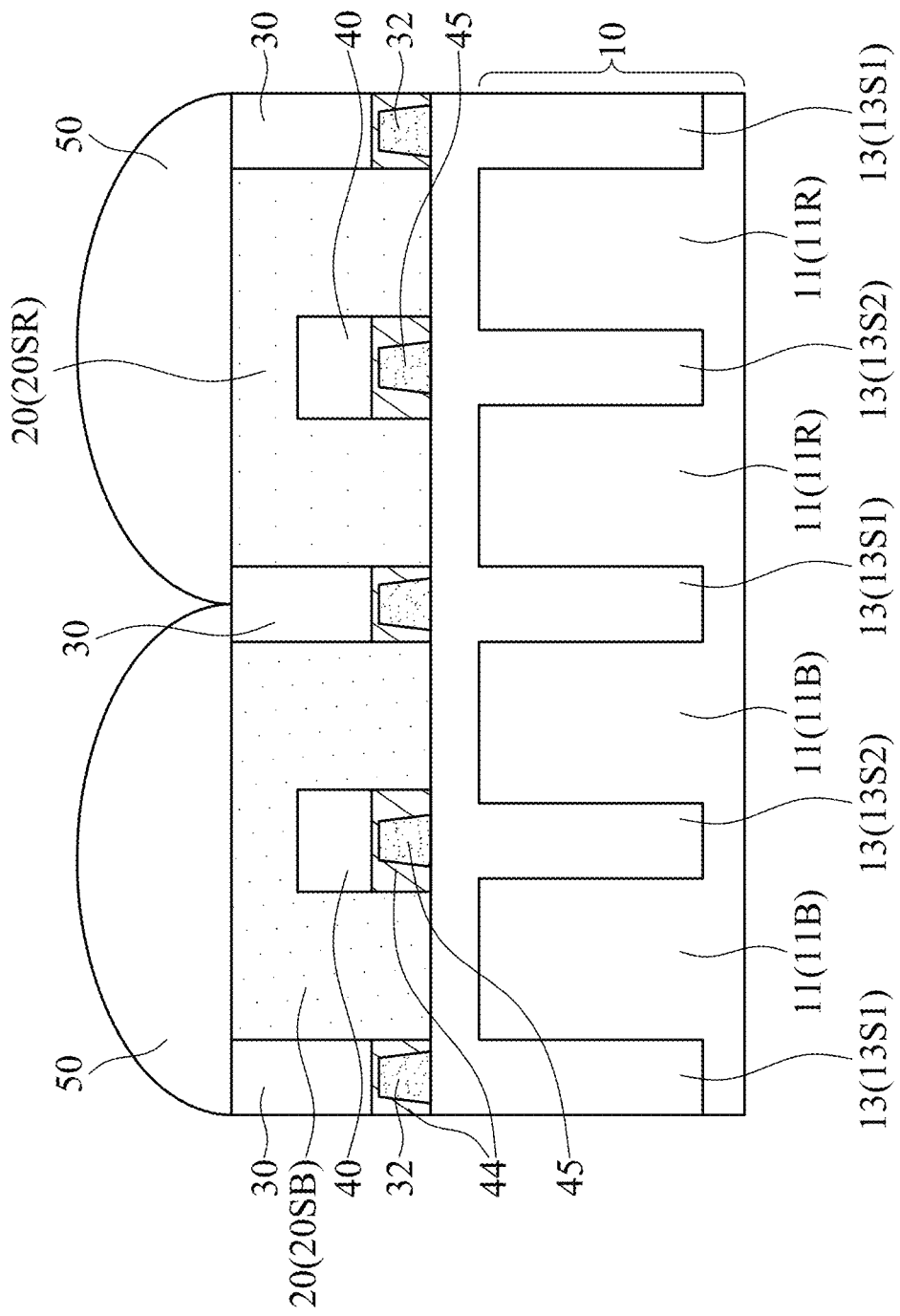
FIG. 27 is a cross-sectional view that may illustrate a portion of the solid-state image sensor in accordance with some embodiments of the present disclosure.

FIG. 26 is a top view illustrating a portion of the solid-state image sensor 132' in accordance with some other embodiments of the present disclosure. FIG. 27 is a cross-sectional view CS8' that may illustrate a portion of the solid-state image sensor 132' in accordance with some other embodiments of the present disclosure. For example, FIG.

27 may be a cross-sectional view of a portion of the solid-state image sensor 132' along line K-K' in FIG. 26. It should be noted that some components of the solid-state image sensor 132' have been omitted in FIG. 26 and FIG. 27 for the sake of brevity.

Referring to FIG. 26 and FIG. 27, the solid-state image sensor 132' has a similar structure to the solid-state image sensor 132 shown in FIG. 24. The main difference from the solid-state image sensor 132 shown in FIG. 24 is that the solid-state image sensor 132' further includes an inner pillar 45 disposed on the bottom of the light-splitting structure 40. That is, the auxiliary light-splitting structure 44 may cover at least a portion of the inner pillar 45, but the present disclosure is not limited thereto.

Figure 28:
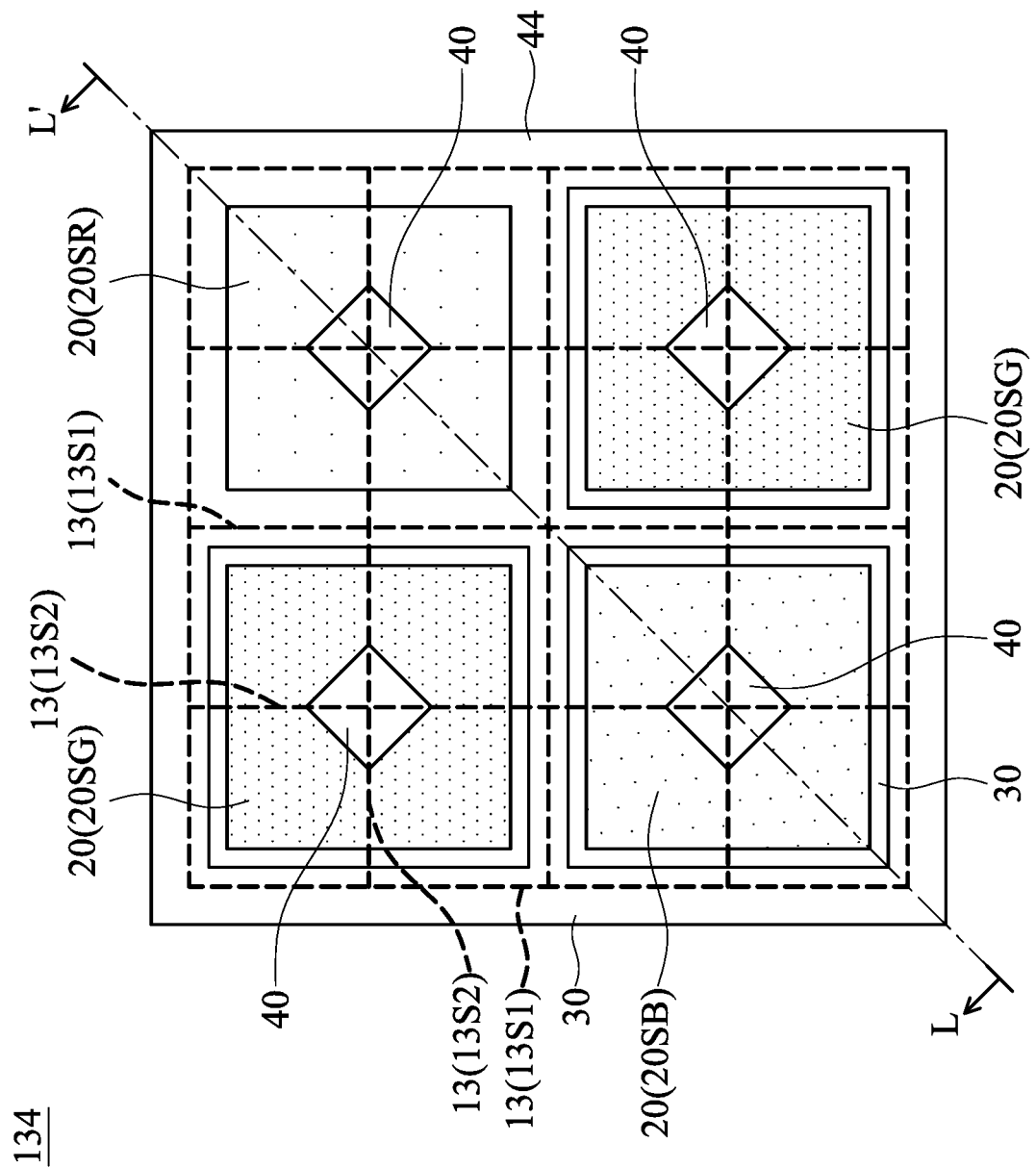
FIG. 28 is a top view illustrating a portion of the solid-state image sensor in accordance with some embodiments of the present disclosure.
Figure 29:
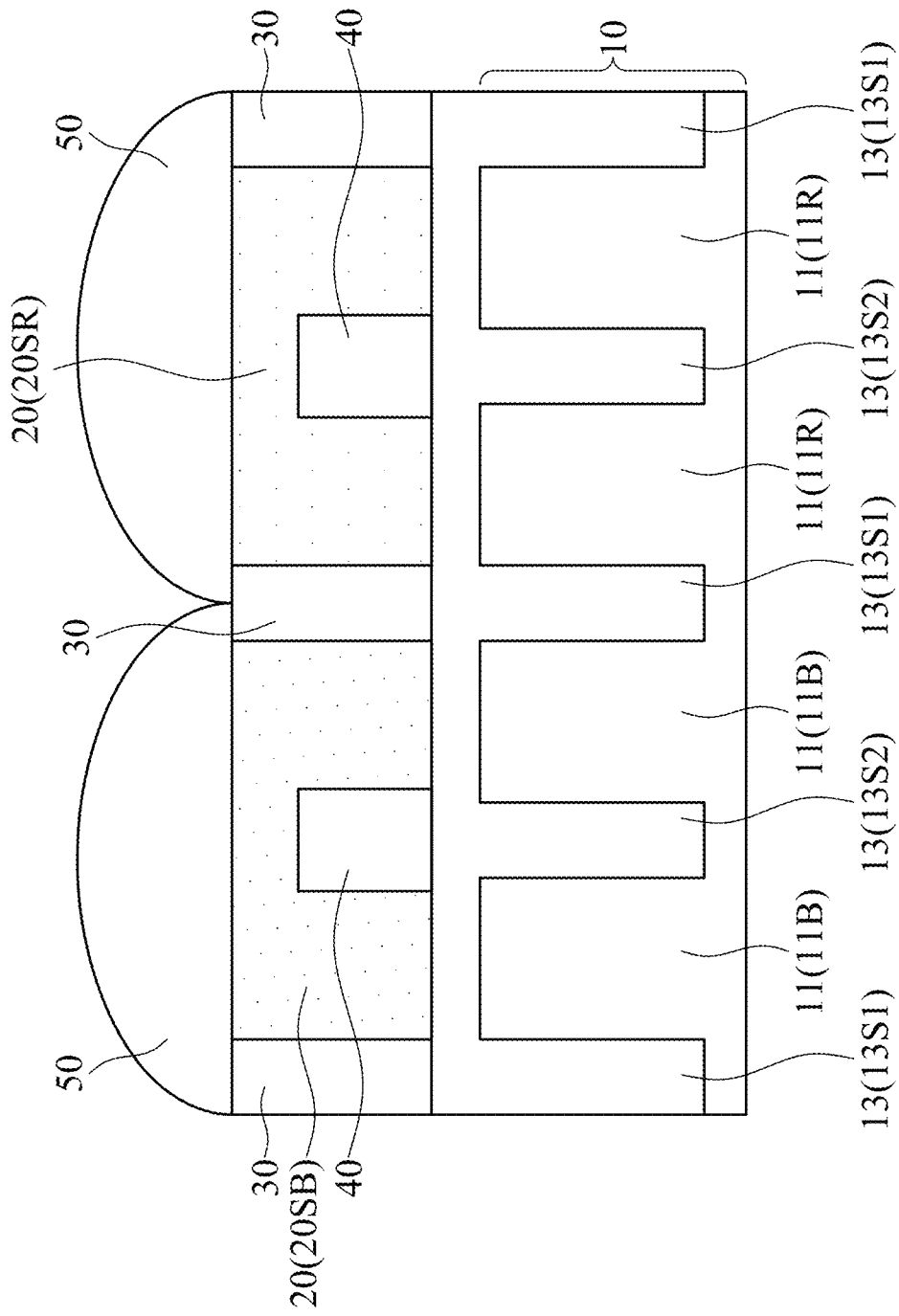
FIG. 29 is a cross-sectional view that may illustrate a portion of the solid-state image sensor in accordance with some embodiments of the present disclosure.

In the foregoing embodiments, the light-shielding layer 32 is disposed on the bottom of the grid structure 30, but the present disclosure is not limited thereto. FIG. 28 is a top view illustrating a portion of the solid-state image sensor 134 in accordance with some other embodiments of the present disclosure. FIG. 29 is a cross-sectional view CS9 that may illustrate a portion of the solid-state image sensor 134 in accordance with some other embodiments of the present disclosure. For example, FIG. 29 may be a cross-sectional view of a portion of the solid-state image sensor 134 along line L-L' in FIG. 28. It should be noted that some components of the solid-state image sensor 134 have been omitted in FIG. 28 and FIG. 29 for the sake of brevity.

Referring to FIG. 28 and FIG. 29, the solid-state image sensor 134 has a similar structure to the solid-state image sensor 100 shown in FIG. 1. The main difference from the solid-state image sensor 100 shown in FIG. 1 is that the solid-state image sensor 134 includes no light-shielding layer 32 disposed on the bottom of the grid structure 30. Similarly, in some other embodiments, the solid-state image sensor 134 further includes an inner pillar 45 disposed on the bottom of the light-splitting structure 40 (not shown in FIG. 28 and FIG. 29). Other similar features will not be repeated here.

Figure 30:
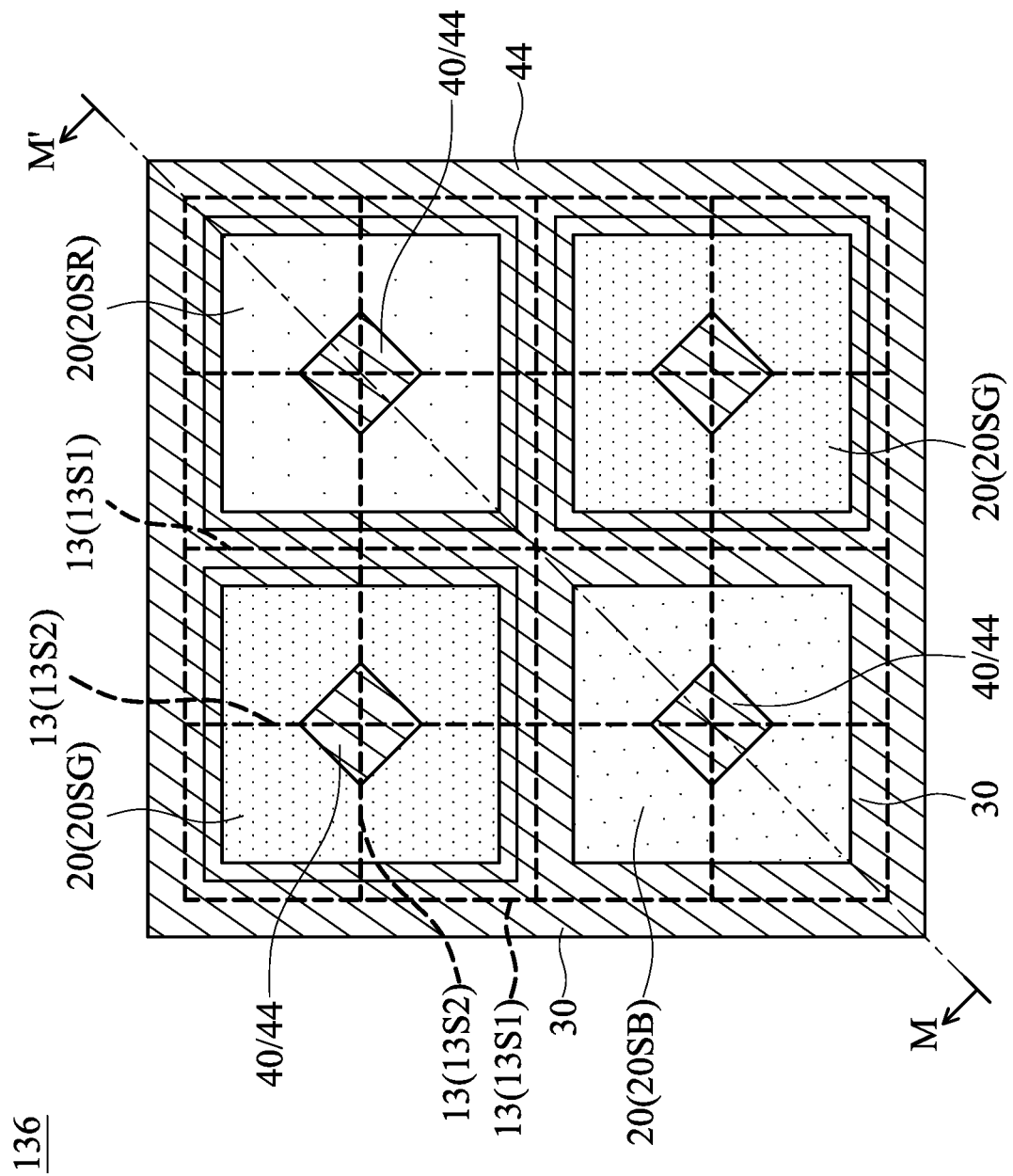
FIG. 30 is a top view illustrating a portion of the solid-state image sensor in accordance with some embodiments of the present disclosure.
Figure 31:
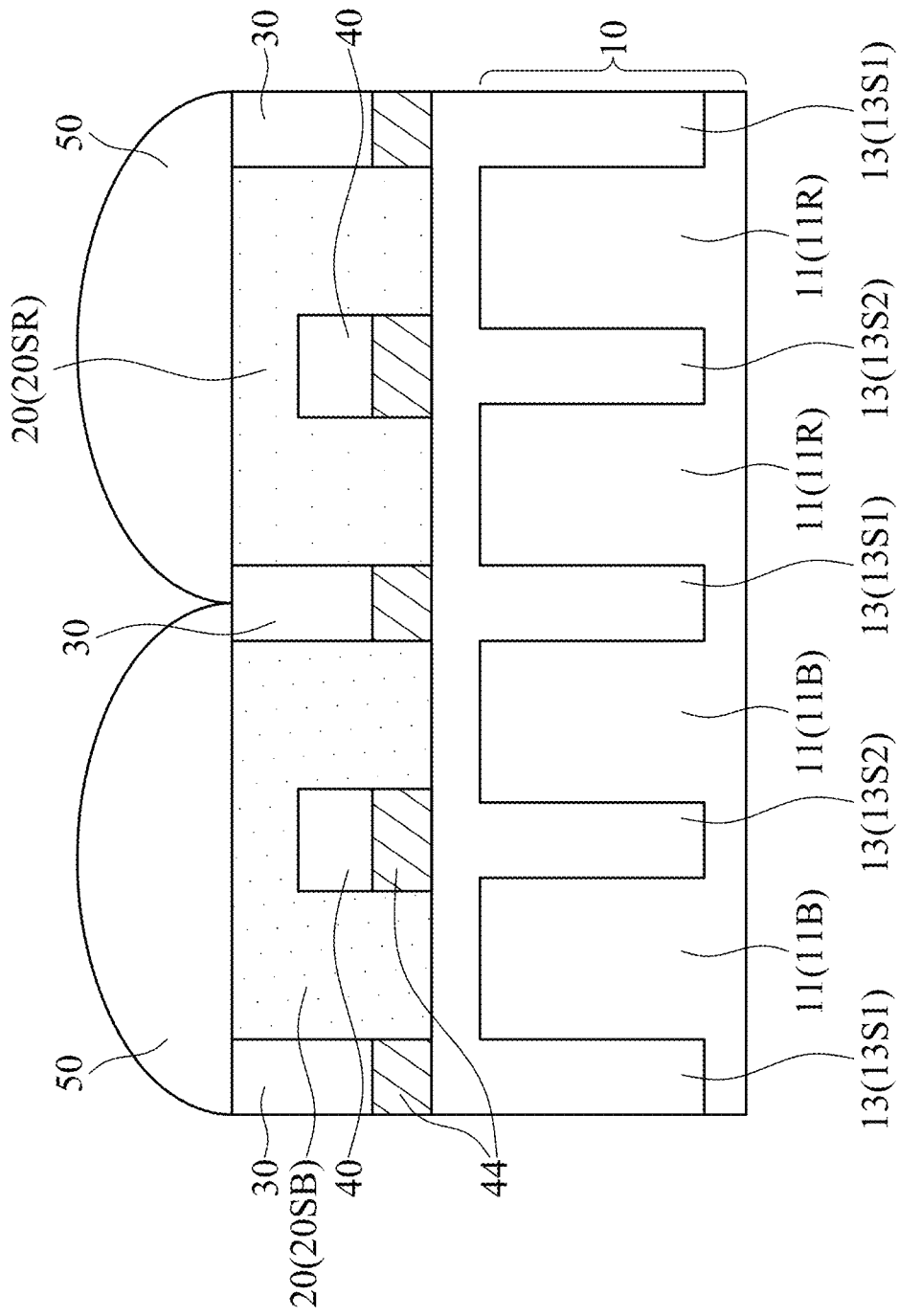
FIG. 31 is a cross-sectional view that may illustrate a portion of the solid-state image sensor in accordance with some embodiments of the present disclosure.

FIG. 30 is a top view illustrating a portion of the solid-state image sensor 136 in accordance with some other embodiments of the present disclosure. FIG. 31 is a cross-sectional view CS10 that may illustrate a portion of the solid-state image sensor 136 in accordance with some other embodiments of the present disclosure. For example, FIG. 31 may be a cross-sectional view of a portion of the solid-state image sensor 136 along line L-L' in FIG. 30. It should be noted that some components of the solid-state image sensor 136 have been omitted in FIG. 30 and FIG. 31 for the sake of brevity.

Referring to FIG. 30 and FIG. 31, the solid-state image sensor 136 has a similar structure to the solid-state image sensor 134 shown in FIG. 28. The main difference from the solid-state image sensor 134 shown in FIG. 28 is that the solid-state image sensor 136 further includes an auxiliary light-splitting structure 44 disposed on the bottom of the light-splitting structure 40. Moreover, as shown in FIG. 30 and FIG. 31, in some embodiments, the auxiliary light-splitting structure 44 is further disposed on the bottom of the grid structure 30.

In summary, the solid-state image sensor of the embodiments of the present disclosure includes a light-splitting structure disposed in (the color filter segment of) the color filter layer, which may effectively reduce scattering and crosstalk, thereby improving the quality of the image signal from the photoelectric conversion elements of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
    photoelectric conversion elements, wherein the photoelectric conversion elements are divided into first photoelectric conversion elements and second photoelectric conversion elements;
    a color filter layer disposed above the photoelectric conversion elements and having a first color filter segment and a second color filter segment adjacent to the first color filter segment, wherein the first color filter segment and the second color filter segment correspond to different colors, the first color filter segment corresponds to the first photoelectric conversion elements, and the second color filter segment corresponds to the second photoelectric conversion elements;
    a light-splitting structure disposed in the first color filter segment or the second color filter segment;
    a grid structure disposed between the first color filter segment and the second color filter segment, wherein the light-splitting structure is separated from the grid structure; and
    an isolation structure disposed between the photoelectric conversion elements and having first isolation segments and second isolation segments,
    wherein the first isolation segments are disposed between the first photoelectric conversion elements and the second photoelectric conversion elements, the second isolation segments are disposed between the first photoelectric conversion elements and between the second photoelectric conversion elements, the grid structure corresponds to the first isolation segments, and the light-splitting structure corresponds to at least one of the second isolation segments, and wherein from a top view of the solid-state image sensor, the light-splitting structure is offset from a corresponding one of the second isolation segments by over 0 to 45 degrees.

2. The solid-state image sensor as claimed in claim 1, wherein the grid structure has a first shift with respect to the first isolation segments, and the light-splitting structure has a second shift with respect to a corresponding one of the second isolation segments.

3. The solid-state image sensor as claimed in claim 2, wherein the first shift is different from the second shift.

4. The solid-state image sensor as claimed in claim 1, wherein a height of the light-splitting structure is equal to or less than a height of the grid structure.

5. The solid-state image sensor as claimed in claim 1, wherein from a top view of the solid-state image sensor, a profile of the light-splitting structure is cross-shaped.

6. The solid-state image sensor as claimed in claim 1, wherein a ratio of a height of the light-splitting structure to a height of the color filter layer is between 0.3 and 0.9.

7. The solid-state image sensor as claimed in claim 1, wherein a refractive index of the light-splitting structure is between 1 and 1.45.

8. The solid-state image sensor as claimed in claim 1, wherein the light-splitting structure corresponds to two photoelectric conversion elements or four photoelectric conversion elements.

9. The solid-state image sensor as claimed in claim 1, further comprising:
an inner pillar disposed on a bottom of the light-splitting structure, wherein the inner pillar comprises nontransparent material.

10. The solid-state image sensor as claimed in claim 9, wherein a width of the inner pillar is between 50 nm and 100 nm, and a height of the inner pillar is less than 150 nm.

11. The solid-state image sensor as claimed in claim 1, further comprising:
an auxiliary light-splitting structure disposed on a bottom of the light-splitting structure.

12. The solid-state image sensor as claimed in claim 11, wherein the auxiliary light-splitting structure is further disposed on a bottom of the grid structure.

13. The solid-state image sensor as claimed in claim 11, wherein the auxiliary light-splitting structure comprises at least one material that is different from the light-splitting structure, and a refractive index of the auxiliary light-splitting structure is between 1 and 1.65.

14. The solid-state image sensor as claimed in claim 11, wherein a width of the auxiliary light-splitting structure is equal to or greater than a width of the light-splitting structure, and a height of the auxiliary light-splitting structure is between 50 nm and 350 nm.

15. A solid-state image sensor, comprising:
photoelectric conversion elements;
a color filter layer disposed above the photoelectric conversion elements and having a first color filter segment and a second color filter segment adjacent to the first color filter segment, wherein the first color filter segment and the second color filter segment correspond to different colors;
a light-splitting structure disposed in the first color filter segment or the second color filter segment; and
a grid structure disposed between the first color filter segment and the second color filter segment, wherein the light-splitting structure is separated from the grid structure,
wherein the light-splitting structure has a first portion disposed on the center of the first color filter segment or the second color filter segment and a second portion disposed near at least one corner of the first color filter segment or the second color filter segment.

* * * * *